United States Patent
Gotanda et al.

(10) Patent No.: US 10,950,810 B2
(45) Date of Patent: Mar. 16, 2021

(54) PHOTOELECTRIC CONVERSION ELEMENT, AND METHOD AND APPARATUS FOR MANUFACTURING THE SAME

(71) Applicant: KABUSHIKI KAISHA TOSHIBA, Minato-ku (JP)

(72) Inventors: Takeshi Gotanda, Yokohama (JP); Hyangmi Jung, Yokohama (JP)

(73) Assignee: KABUSHIKI KAISHA TOSHIBA, Minato-ku (JP)

(*) Notice: Subject to any disclaimer, the term of this patent is extended or adjusted under 35 U.S.C. 154(b) by 0 days.

(21) Appl. No.: 16/690,369

(22) Filed: Nov. 21, 2019

(65) Prior Publication Data

US 2020/0091451 A1 Mar. 19, 2020

Related U.S. Application Data

(62) Division of application No. 15/436,113, filed on Feb. 17, 2017, now abandoned.

(30) Foreign Application Priority Data

Sep. 23, 2016 (JP) .............................. JP2016-185215

(51) Int. Cl.
*H01L 51/42* (2006.01)
*H01L 51/00* (2006.01)

(52) U.S. Cl.
CPC ...... *H01L 51/4246* (2013.01); *H01L 51/0029* (2013.01); *Y02E 10/549* (2013.01)

(58) Field of Classification Search
None
See application file for complete search history.

(56) References Cited

U.S. PATENT DOCUMENTS

2005/0236967 A1 10/2005 Sugimoto
2015/0249170 A1 9/2015 Snaith et al.
(Continued)

FOREIGN PATENT DOCUMENTS

JP 2015-535390 12/2015
JP 2016-51693 4/2016
(Continued)

OTHER PUBLICATIONS

Takeo Oku et al., Microstructures and photovoltaic properties of perovskite-type $CH_3NH_3PbI_3$ compounds, Applied Physics Express 7, 121601 (2014).
(Continued)

*Primary Examiner* — Erik Kielin
(74) *Attorney, Agent, or Firm* — Oblon, McClelland, Maier & Neustadt, L.L.P.

(57) ABSTRACT

A photoelectric conversion element according to an embodiment includes: a first electrode; a second electrode; and a photoelectric conversion layer that is in contact with the first electrode and the second electrode and includes an active layer containing a perovskite compound. The active layer gives an X-ray diffraction pattern having a first diffraction peak ascribed to the (004) plane of the perovskite compound and a second diffraction peak ascribed to the (220) plane of the perovskite compound. The ratio of the maximum intensity of the first diffraction peak to the maximum intensity of the second diffraction peak is 0.18 or more.

6 Claims, 15 Drawing Sheets

(56) References Cited

U.S. PATENT DOCUMENTS

| | | |
|---|---|---|
| 2016/0155974 A1 | 6/2016 | Wang |
| 2017/0012404 A1 | 1/2017 | Xing |
| 2017/0084399 A1* | 3/2017 | Vak .................. H01L 27/302 |
| 2017/0098514 A1 | 4/2017 | Geohegan |
| 2017/0104169 A1 | 4/2017 | Li |
| 2017/0152608 A1 | 6/2017 | Jin |
| 2017/0338045 A1 | 11/2017 | Vak |
| 2018/0096797 A1* | 4/2018 | Satou .................. H01L 51/0003 |
| 2019/0074140 A1 | 3/2019 | Saidaminov |
| 2019/0185495 A1 | 6/2019 | Cahen |

FOREIGN PATENT DOCUMENTS

| | | |
|---|---|---|
| WO | WO 2014/045021 A1 | 3/2014 |
| WO | 2015/139082 A1 | 9/2015 |

OTHER PUBLICATIONS

Sneha A. Kulkarni et al., "Band-gap tuning of lead halide perovskites using a sequential deposition process". Journal of Materials Chemistry A; 2014, 2; pp. 9221-9225.

Chen Tao et al., "17.6% stabilized efficiency in low-temperature processed planar perovskite solar cells", Energy & Environmental Science; No. 8; 2015; pp. 6.

Min Hu et al, "Efficient hole-conductor-free, fully printable mesoscopic perovskite solar cells with a broad light harvester $NH_2CH=NH_2PbI_3$", Journal of Materials Chemistry A, No. 2, 2014, pp. 7.

Xianfeng Gao et al., "Enhanced photovoltaic performance of perovskite $CH_3NH_3PbI_3$ solar cells with freestanding $TiO_2$ nanotube array films", Chem. Commun., No. 50, 2014, pp. 4.

Sigalit Aharon et al., "Hybrid Lead Halide Iodide and Lead Halide Bromide in Efficient Hole Conductor Free Perovskite Solar Cell", The Journal of Physical Chemistry C, No. 118, 2014, pp. 6.

Qiong Wang et al., "Transition from the Tetragonal to Cubic Phase of Organohalide Perovskite; The Role of Chlorine in Crystal Formation of $CH_3NH_3PbI_3$ on $TiO_2$ substrates", The Journal of Physical Chemistry Letters, No. 6, 2015, pp. 6.

Ling, Li, et al. "Precisely Controlled Hydration Water for Performance Improvement of Organic-Inorganic Perovskite Solar Cells", Advanced Functional Materials vol. 26, Issue 28, May 19, 2016, pp. 5028-5034.

* cited by examiner

US 10,950,810 B2

PHOTOELECTRIC CONVERSION ELEMENT, AND METHOD AND APPARATUS FOR MANUFACTURING THE SAME

CROSS-REFERENCE TO RELATED APPLICATIONS

This is a divisional application of and claims the benefit of priority under 35 U.S.C. § 120 from U.S. Ser. No. 15/436,113, filed on Feb. 17, 2017, which is based upon and claims the benefit of priority from Japanese Patent Application No. 2016-185215, filed on Sep. 23, 2016; the entire contents of which are incorporated herein by reference.

FIELD

Embodiments described herein relate generally to a photoelectric conversion element, and a method and an apparatus for manufacturing a photoelectric conversion element.

BACKGROUND

A photoelectric conversion element is manufactured by using a relatively complex method such as a vapor deposition method. However, using a coating method or a printing method makes it possible to simply manufacture the photoelectric conversion element at a cost lower than ever before.

As the photoelectric conversion element, a solar cell, a sensor, a light emitting element, and so on each using an organic material or an organic material and an inorganic material, for example, are under development. In developing the above-described photoelectric conversion element, an improvement in photoelectric conversion characteristics is required.

DETAILED DESCRIPTION

A photoelectric conversion element according to an embodiment includes: a first electrode; a second electrode; and a photoelectric conversion layer that is in contact with the first electrode and the second electrode and includes an active layer containing a perovskite compound. The active layer gives an X-ray diffraction pattern having a first diffraction peak ascribed to the (004) plane of the perovskite compound and a second diffraction peak ascribed to the (220) plane of the perovskite compound. The ratio of the maximum intensity of the first diffraction peak to the maximum intensity of the second diffraction peak is 0.18 or more.

Hereinafter, embodiments will be explained with reference to the drawings. The drawings are schematic, and for example, dimensions of the thickness, width, and so on of constituent elements may differ from actual dimensions of the constituent elements. In the embodiments, substantially the same constituent elements are denoted by the same reference signs and an explanation thereof will be omitted in some cases.

Figure 1:
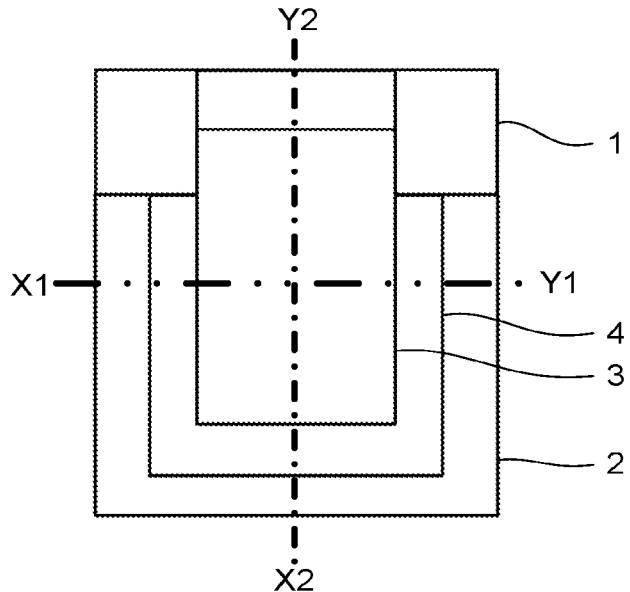
FIG. 1 is a top surface schematic view illustrating a structure example of a photoelectric conversion element.
Figure 2:
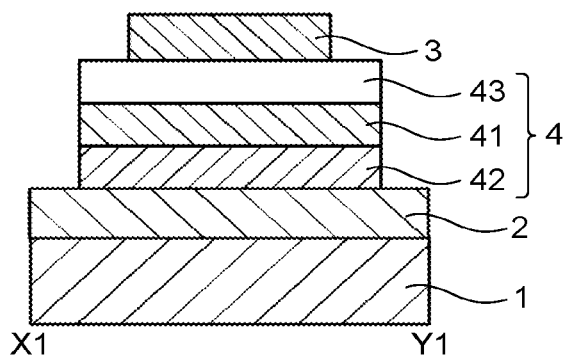
FIG. 2 is a cross-section schematic view illustrating the structure example of the photoelectric conversion element.
Figure 3:
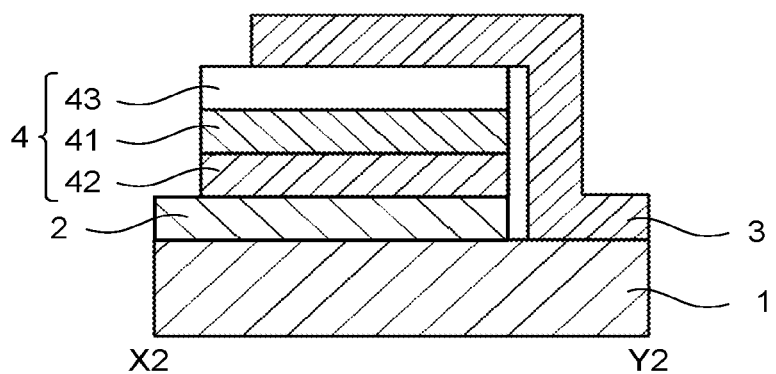
FIG. 3 is a cross-section schematic view illustrating the structure example of the photoelectric conversion element.

FIG. 1 to FIG. 3 are views illustrating a structure example of a photoelectric conversion element. FIG. 1 is a top surface schematic view. FIG. 2 is a cross-section schematic view taken along the line segment X1-Y1 in FIG. 1. FIG. 3 is a cross-section schematic view taken along the line segment X2-Y2 in FIG. 1. As the photoelectric conversion element according to the embodiment, for example, a light emitting element, a solar cell, a sensor, and the like can be cited.

The photoelectric conversion element illustrated in FIG. 1 to FIG. 3 includes a substrate 1, an electrode 2, an electrode 3, and a photoelectric conversion layer 4 in contact with the electrode 2 and the electrode 3.

The substrate 1 supports the electrode 2, the electrode 3, and the photoelectric conversion layer 4. The case when light enters the photoelectric conversion layer 4 through the substrate 1 means that the substrate 1 has a light transmitting property.

The electrode 2 is provided on the substrate 1. The electrode 2 has a function as one of an anode electrode and a cathode electrode.

The electrode 3 is provided separately from the electrode 2 with the photoelectric conversion layer 4 interposed therebetween. The electrode 3 is provided on the photoelectric conversion layer 4 and extends down to the substrate 1. The electrode 3 has a function as the other of the anode electrode and the cathode electrode.

The photoelectric conversion layer 4 is provided between the electrode 2 and the electrode 3. The photoelectric conversion layer 4 includes an active layer 41, a buffer layer 42, and a buffer layer 43. At least one of the buffer layer 42 and the buffer layer 43 is not necessarily provided.

The active layer 41 is provided between the electrode 2 and the electrode 3, and is provided on the buffer layer 42. In the case of the photoelectric conversion element being a solar cell, the active layer 41 may perform charge generation and excitation generation by energy of the entering light. In the case of the photoelectric conversion element being a light emitting element, the active layer 41 may have a function as a light emitting layer.

The active layer 41 contains a perovskite compound. The perovskite compound is a compound having the same crystal structure as that of perovskite.

Containing the perovskite compound enables an increase in conversion efficiency.

The perovskite compound is expressed by a general formula: $ABX_3$. As A, for example, primary ammonium ions can be utilized. Examples of the primary ammonium ion include $CH_3NH_3^+$, $C_2H_5NH_3^+$, $C_3H_7NH_3^+$, $C_4H_9NH_3^+$, $HC(NH_2)_2^+$, and so on. The primary ammonium ion is preferred to be, for example, $CH_3NH_3+$, but is not limited thereto. Further, A is also preferred to be Cs, or 1,1,1-trifluoro-ethyl ammonium iodide (FEAT), but is not limited thereto.

As B, for example, divalent metal ions can be utilized. The divalent metal ion is preferred to be, for example, $Pb^{2+}$, $Sn^{2+}$, or the like, but is not limited thereto. When B ions are smaller than A ions, a perovskite structure is formed easily.

As X, halogen ions can be utilized. Examples of the halogen ion include $F^-$, $Cl^-$, $Br^-$, $I^-$, $At^-$, and so on. The halogen ion is preferred to be $Cl^-$, $Br^-$, or $I^-$, in particular, but is not limited thereto.

The material constituting each of A, B, and X may be a single material or a composite material. The constituting ions can function even though they do not necessarily match the ratio of $ABX_3$.

The perovskite compound has a unit lattice such as a cubic crystal, a tetragonal crystal, or a orthorhombic crystal. An A atom is located at each vertex, a B atom is located at the body center, and an X atom is located at each face center of a cubic crystal based on these locations. In this crystal structure, an octahedron composed of one B atom and six X atoms, which is included in the unit lattice, is easily distorted due to an interaction with the A atoms and undergoes phase transition to a symmetric crystal. This phase transition dramatically changes the physical property of crystal, and electrons or holes are discharged to the outside of the crystal to enable power generation.

When the active layer 41 is increased in thickness, a light absorption amount increases and a short-circuit current density $J_{SC}$ increases, but a carrier transportation distance increases, and thus the loss due to deactivation tends to increase. Therefore, for the purpose of obtaining the maximum efficiency, the thickness of the active layer 41 is preferred to be 30 nm or more and 1000 nm or less, and further preferred to be 60 nm or more and 600 nm or less.

As long as the thickness of the active layer 41 is adjusted individually, the photoelectric conversion element according to the embodiment and another general photoelectric conversion element can be adjusted so as to have the same conversion efficiency under a sunlight irradiation condition. However, they are different in film properties, so that the photoelectric conversion element according to the embodiment can achieve a conversion efficiency higher than that of the general photoelectric conversion efficiency under a low illuminance condition of 200lx or the like.

Figure 4:
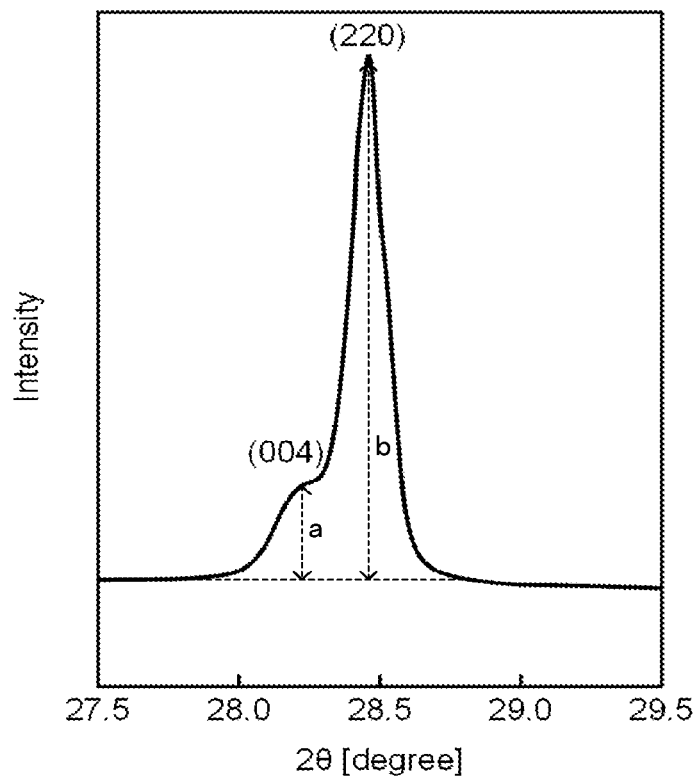
FIG. 4 is a view illustrating an example of an XRD diffraction pattern.

The crystal structure of the perovskite compound is analyzed by X-ray diffraction (XRD) measurement, for example. FIG. 4 is a view illustrating a part of an X-ray diffraction pattern of the active layer 41 obtained by the XRD. The diffraction pattern illustrated in FIG. 4 has a first diffraction peak ascribed to the (004) plane of the perovskite compound within a range of 28.0 to 28.3 degrees of a diffraction angle (2θ) and has a second diffraction peak ascribed to the (220) plane of the perovskite compound near 28.5 degrees of the diffraction angle (2θ). Although crystal planes are defined by Miller indices, their names are changed by how a unit cell is defined. The first diffraction peak sometimes overlaps with the second diffraction peak. In this case, an inflection point in a region where a reduction in intensity increase per unit angle is caused when seen from the low-angle side is defined as the peak of the first diffraction peak. Alternatively, a shape is approximated by a least square method or the like assuming that each diffraction peak is normally distributed at the low-angle side and the wide-angle side, and thereby a single peak shape is found, from which the peak of the first diffraction peak can be defined. As for the maximum intensity ratio, as illustrated in FIG. 4, intensities a and b from a base line are found as the maximum intensities of (004) and (220).

Having the first diffraction peak means that the crystal structure of the perovskite compound has high stability. Further, in the diffraction pattern illustrated in FIG. 4, the ratio of the maximum intensity of the first diffraction peak to the maximum intensity of the second diffraction peak is 0.18 or more. When it is less than 0.18, the perovskite compound is not formed sufficiently and the conversion efficiency is likely to decrease. (004) is a crystal plane intersecting with (220) perpendicularly, and therefore the both being detected proves that an ordered structure of the crystal structure is formed three-dimensionally. The case where the perovskite compound is formed using an organic material as a base in particular does not include one to be the origin of crystal nucleation, resulting in difficulty in crystal growth. They being detected even in this case means that the ordered structure is good three-dimensionally. The intensity of the diffraction peak sometimes weakens due to not only existence of the crystal planes, but also interference with another crystal plane, particularly a parallel plane. In consideration of these, the ratio of 0.18 or more means that the three-dimensional ordered structure in the perovskite compound is enhanced.

As above, the photoelectric conversion element according to the embodiment includes the active layer containing the perovskite compound expressed by the above-described X-ray diffraction pattern. The crystal structure of the above-described perovskite compound has high stability. This makes it possible to increase the photoelectric conversion efficiency.

The buffer layer 42 is provided between the electrode 2 and the active layer 41 and is provided on a part of the electrode 2. The buffer layer 43 is provided between the active layer 41 and the electrode 3 and is provided on the active layer 41.

The buffer layer 42 and the buffer layer 43 are each provided as one of intermediate layers. One of the buffer layer 42 and the buffer layer 43 functions as a hole transport layer, and the other of them functions as an electron transport layer. The hole transport layer has a function to efficiently transport holes. The electron transport layer has a function to efficiently transport electrons.

The substrate 1, the electrode 2, the electrode 3, the active layer 41, the buffer layer 42, and the buffer layer 43 are further explained.

The substrate 1 is preferably formed of a material that does not change in quality by heat to be applied when forming electrodes or by an organic solvent to be in contact therewith because the electrode is formed on a surface thereof. As the material of the substrate 1, there can be cited, for example, inorganic materials such as non-alkali glass and quartz glass, plastics such as polyethylene, polyethylene terephthalate (PET), polyethylene naphthalate (PEN), polyimide, polyamide, polyamide-imide, liquid crystal polymer, and cycloolefin polymer, an organic material such as a polymer film, stainless steel such as SUS, metal materials such as aluminum, titanium, and silicon, and so on.

The light transmitting property of the substrate 1 is appropriately selected according to the structure of the intended photoelectric conversion element. When light enters the active layer 41 from the substrate 1 side, a substrate having a light transmitting property is used. When light enters the active layer 41 from the electrode 3 side, the substrate 1 does not need to have a light transmitting property.

The thickness of the substrate 1 is not limited in particular as long as the substrate 1 has sufficient strength for supporting other constituent members. When the substrate 1 is disposed on a light entrance surface side, an anti-reflection film having, for example, a moth-eye structure can be provided on the light entrance surface. Applying such a structure makes it possible to efficiently take in light and improve energy conversion efficiency of a cell. The moth-eye structure is a structure having a regular projection array of about 100 nm on a surface thereof, and due to this projection structure, the refractive index in a thickness direction changes continuously. Therefore, interposition of a non-reflective film makes the surface with a discontinuous change in refractive index disappear, resulting in a reduction in reflection of light and an improvement in cell efficiency. The substrate 1 may be used alone or used in combination to exhibit the function of the photoelectric conversion element. Specifically, a solar cell having had the present application applied thereto may be formed on an already-completed silicon solar cell to fabricate a tandem solar cell. In this case, an equivalent circuit is preferred to be a parallel circuit. Further, the first electrode and the intermediate layer may be shared with the silicon solar cell. In this case, the equivalent circuit is preferred to be a series circuit.

A material having conductivity can be used for the electrode 2 and the electrode 3. A material having a light transmitting property and conductivity may be used for the electrode 2 and the electrode 3. Examples of the material applicable to the electrode 2 and the electrode 3 include metal oxide materials such as an indium oxide, a zinc oxide, a tin oxide, an indium tin oxide (ITO) being a composite body of these, a fluorine-doped tin oxide (FTO), and a film (NESA or the like) fabricated by using electrically conductive glass made of indium, zinc, oxide, and the like, and metal materials such as gold, platinum, silver, and copper. Particularly, ITO or FTO is preferred. At least one of the electrode 2 and the electrode 3 may have a single-layer structure or a stacked-layer structure of layers containing materials with different work functions.

The thickness of at least one of the electrode 2 and the electrode 3 is preferred to be 30 nm or more and 300 nm or less in the case of the material of the electrode being ITO. When it is less than 30 nm, conductivity is likely to decrease to increase resistance. When the resistance is large, the photoelectric conversion efficiency decreases in some cases. When it becomes greater than 300 nm, flexibility of an ITO film decreases and cracking sometimes occurs when stress is applied. At least one of the electrode 2 and the electrode 3 preferably has a sheet resistance of 10Ω/ or less.

When the electrode 2 or the electrode 3 is brought into contact with the electron transport layer, a material having a low work function is preferably used as the electrode material. Examples of the material with a low work function include alkali metal, alkali-earth metal, and so on. Concrete examples include Li, In, Al, Ca, Mg, Sm, Tb, Yb, Zr, Na, K, Rb, Cs, Ba, and alloys of the above. Further, the material may be an alloy of the metal selected from the above-described materials low in work function and a metal with a relatively high work function selected from gold, silver, platinum, copper, manganese, titanium, cobalt, nickel, tungsten, tin, and so on. Examples of the alloy usable for the electrode material include a lithium-aluminum alloy, a lithium-magnesium alloy, a lithium-indium alloy, a magnesium-silver alloy, a calcium-indium ally, a magnesium-aluminum alloy, an indium-silver alloy, a calcium-aluminum alloy, and so on.

In the case of using the above-described material, the thickness of the electrode is preferred to be 1 nm or more and 500 nm or less, and more preferred to be 10 nm or more and 300 nm or less. When it is 1 nm, it is difficult to sufficiently transmit generated charges to an external circuit because the resistance is too large. When it becomes greater than 500 nm, a long period of time is required for electrode formation, to thus increase a material temperature and damage the other materials, resulting in deterioration of performance in some cases. Further, a large amount of material is used, to thus prolong the time of occupying a deposition apparatus, resulting in an increase in cost in some cases.

An organic material can also be used as the electrode material. A conductive high-molecular compound such as, for example, polyethylenedioxythiophene (PEDOT) or the like is preferred. Such a conductive high-molecular compound is put on the market, and there can be cited, for example, Clevios P H 500, Clevios P H, Clevios P VP Al 4083, Clevios HIL 1, 1 (product name, manufactured by H.C. Starck), and so on. The work function (or ionization potential) of PEDOT is 4.4 eV, but the work function of the electrode can be adjusted by combining another material with PEDOT. For example, mixing polystyrenesulfonate (PSS) in PEDOT makes it possible to adjust the work function in a range of 5.0 to 5.8 eV. However, a layer formed of a combination of the conductive high-molecular compound and another material has a possibility that its carrier transportability deteriorates because the ratio of the conductive high-molecular compound decreases relatively. Therefore, the thickness of the electrode in such a case is preferred to be 50 nm or less, and more preferred to be 15 nm or less. As the conductive high-molecular compound, polypyrrole, polythiophene, and polyaniline are preferred.

When one of the buffer layer 42 and the buffer layer 43 functions as the electron transport layer, the electron transport layer preferably contains a halide or a metal oxide. Preferred examples of the halide include LiF, LiCl, LiBr, LiI, NaF, NaCl, NaBr, NaI, KF, KCl, KBr, KI, and CsF. LiF is particularly preferred among the above. Preferred examples of the metal oxide include a titanium oxide, a molybdenum oxide, a vanadium oxide, a zinc oxide, a nickel oxide, a lithium oxide, a calcium oxide, a cesium oxide, an aluminum oxide, and a niobium oxide. The titanium oxide is preferred among the above. As the titanium oxide, an amorphous titanium oxide that can be obtained by hydrolyzing titanium alkoxide by a sol-gel method is preferred.

The electron transport layer may contain an inorganic material such as metal calcium. The thickness of the electron transport layer is preferred to be 20 nm or less. This makes it possible to lower film resistance of the electron transport layer to increase the conversion efficiency. The thickness of the electron transport layer is preferred to be 5 nm or more. This makes it possible to sufficiently exhibit a hole-blocking effect and prevent generated excitations from being deactivated before electrons and holes are discharged. Consequently, it is possible to efficiently take out current.

An n-type organic semiconductor is preferred to be fullerene and a derivative thereof, but is not limited thereto in particular. Examples thereof include derivatives whose basic frameworks are C60, C70, C76, C78, C84, and the like. The fullerene derivative may be one whose carbon atoms in the fullerene framework are modified by arbitrary functional groups, and these functional groups may be bonded each other to form a ring. The fullerene derivative includes a fullerene-bonded polymer. The fullerene derivative that has a functional group high in affinity to a solvent and has high solubility to the solvent is preferred.

Examples of the functional group in the fullerene derivative include: a hydrogen atom; a hydroxyl group; a halogen atom such as a fluorine atom and a chlorine atom; an alkyl group such as a methyl group and an ethyl group; an alkenyl group such as a vinyl group; a cyano group; an alkoxy group such as a methoxy group and an ethoxy group; an aromatic hydrocarbon group such as a phenyl group and a naphthyl group; an aromatic heterocyclic group such as a thienyl group and a pyridyl group; and so on. Specific examples of the fullerene derivative include fullerene hydride such as $C_{60}H_{36}$ and $C_{70}H_{36}$, oxidized fullerene such as $C_{60}$ and $C_{70}$, a fullerene metal complex, and so on. As the fullerene derivative, PCBM([6,6]-phenyl$C_{61}$butyric acid methylester) or
PCBM([6,6]-phenyl$C_{71}$butyric acid methylester) is particularly preferably used.

When the other of the buffer layer 42 and the buffer layer 43 functions as the hole transport layer, the hole transport layer can contain a p-type organic semiconductor material and an n-type organic semiconductor material. The p-type organic semiconductor material and the n-type organic semiconductor material mentioned here indicate materials that can function as an electron donor material and an electron acceptor material when heterojunction and bulk heterojunction are formed.

As the n-type organic semiconductor, a low-molecular compound capable of forming a film by vapor deposition can be used. The low-molecular compound mentioned here indicates a compound whose number average molecular weight Mn and weight average molecular weight Mw agree. Either of them is 10000 or less. BCP(bathocuproine), Bphen (4,7-diphenyl-1,10-phenanthroline), TpPyPB(1,3,5-tri(p-pyrid-3-yl-phenyl)benzene), and DPPS(diphenyl bis(4-pyridin-3-yl)phenyl)silane) are more preferred.

A p-type organic semiconductor preferably contains a copolymer composed of a donor unit and an acceptor unit, for example. As the donor unit, fluorene, thiophene, or the like can be used. As the acceptor unit, benzothiadiazole or the like can be used. Specifically, it is possible to use polythiophene and its derivative, polypyrrole and its derivative, a pyrazoline derivative, an arylamine derivative, a stilbene derivative, a triphenyldiamine derivative, oligothiophene and its derivative, polyvinyl carbazole and its derivative, polysilane and its derivative, a polysiloxane derivative having aromatic amine at a side chain or a main chain, polyaniline and its derivative, a phthalocyanine derivative, porphyrin and its derivative, polyphenylene vinylene and its derivative, polythienylene vinylene and its derivative, a benzodithiophene derivative, a thieno[3,2-b]thiophene derivative, or the like. For the hole transport layer, these materials may be used in combination, or a copolymer composed of comonomers constituting these materials may be used. Among the above, polythiophene and its derivative have excellent stereoregularity and are relatively high in solubility to a solvent, and thus are preferred.

As the material of the hole transport layer, a derivative such as poly[N-9'-heptadecanyl-2,7-carbazole-alto-5,5-(4', 7'-di-2-thienyl-2',1',3'-benzothiadiazole)](PCDTBT) being a copolymer containing carbazole, benzothiadiazole and thiophene may be used. Further, a copolymer of a benzodithiophene (BDT) derivative and a thieno[3,2-b]thiophene derivative is also preferred. For example, poly[[4,8-bis[(2-ethylhexyl)oxy]benzo[1,2-b:4,5-b']dithiophene-2,6-diyl][3-fluoro-2-[(2-ethylhexyl)carbonyl)]thieno[3,4-b]thiophenediyl]](PTB7), PTB7-Th into which a thienyl group having an electron donating property weaker than that of an alkoxy group of PTB7 is introduced (PCE10, or PBDTTT-EFT), and so on are also preferred. Further, as the material of the hole transport layer, a metal oxide can also be used. Preferred examples of the metal oxide include a titanium oxide, a molybdenum oxide, a vanadium oxide, a zinc oxide, a nickel oxide, a lithium oxide, a calcium oxide, a cesium oxide, and an aluminum oxide. These materials have an advantage of being inexpensive. Further, as the material of the hole transport layer, thiocyanate such as copper thiocyanate may be used.

For a transport material such as Spiro-OMeTAD and the p-type organic semiconductor, a dopant can be used. As the dopant, it is possible to use oxygen, 4-tert-butylpyridine, lithium-bis(trifluoromethanesulfonyl)imide(Li-TFSI), acetonitrile, tris[2-(1H-pyrazole-1-yl)pyridine]cobalt(III) tris(hexafluorophosphate), tris[2-(1H-pyrazole-1-yl)pyrimidine]cobalt(III)tris[bis(trisfluoromethylsulfonyl)imide] (MY11), or the like.

As the hole transport layer, a conductive high-molecular compound such as polyethylenedioxythiophene can be utilized. For such a conductive high-molecular compound, a material applicable to the electrodes 2 and 3 can be used. In the hole transport layer as well, the material can be adjusted to a material having a work function appropriate as the hole transport layer or the like by combining another material with a polythiophene-based polymer such as PEDOT. Here, the work function of the hole transport layer is preferably adjusted to be lower than a valence band of the active layer 41. Further, it can be adjusted by mixing PSS with PEDOT.

Figure 5:
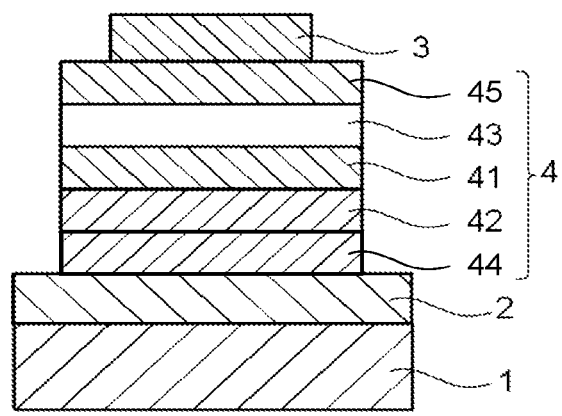
FIG. 5 is a cross-section schematic view illustrating another structure example of the photoelectric conversion element.

The structure example of the photoelectric conversion layer 4 is not limited to the structure illustrated in FIG. 1 to FIG. 3. FIG. 5 is a cross-section schematic view illustrating another structure example of the photoelectric conversion element.

The photoelectric conversion element illustrated in FIG. 5 includes a photoelectric conversion layer 4 further including a base layer 44 and a protective layer 45 in addition to the configuration illustrated in FIG. 1 to FIG. 3.

The base layer 44 is provided between the electrode 2 and the active layer 41 as one of the intermediate layers. The base layer 44 is preferably made of a low-molecular compound. The low-molecular compound mentioned here means that the number average molecular weight Mn and the weight average molecular weight Mw agree and they are 10000 or less each. As the low-molecular compound, there can be cited, for example, materials containing low-molecular compounds such as organosulfur molecules, organic selenium/tellurium molecules, a nitrite compound, monoalkylsilane, carboxylic acid, phosphonic acid, phosphoric ester, organic silane molecules, unsaturated hydrocarbon, alcohol, aldehyde, alkyl bromide, a diazo compound, and alkyl iodide. For example, 4-fluorobenzoic acid (FBA) is preferred. Further, as the base layer 44, an organic material applicable to the electrode 2 may be used. In this case, the base layer 44 may be regarded as a part of the electrode 2.

The base layer 44 is formed by applying a solution containing the low-molecular compound on the electrode 2 and drying the solution. The base layer 44 can improve collection efficiency of carries moving from the active layer 41 to the electrode 2 or the electrode 3 by means of vacuum level shift caused a dipole. The base layer 44 enables an improvement in crystallinity of the perovskite compound, suppression of pin holes to occur in the active layer 41, and an increase in amount of transmitted light on the light-receiving surface side. This makes it possible to increase a current density, improve the fill factor FF, and improve the photoelectric conversion efficiency and light emission efficiency.

The base layer 44 is provided when forming the active layer 41 containing the perovskite compound on a large lattice-mismatched crystal-based buffer layer other than a titanium oxide and an aluminum oxide in particular or an electrode, and thereby the base layer 44 itself can be a stress relaxation layer, or a stress relaxation function can be given to a part of the perovskite compound adjacent to the base layer 44. The base layer 44 enables release of internal stress caused by crystal growth, suppression of generation of pin holes in the active layer 41, and achievement of good interface junction as well as an improvement in crystallinity of the perovskite compound.

As the base layer 44, a base layer made of a metal oxide having a mesoporous structure or a dense structure with no voids and the like can be used. As a metal element, titanium, silicon, copper, molybdenum, nickel, zinc, niobium, tin, vanadium, or tungsten is more preferred. Providing the base layer 44 enables suppression of a leakage current between the electrode 2 and the electrode 3 even though pin holes, cracks, voids, or the like occur in the active layer 41.

When the crystallinity of the perovskite compound increases, separation occurs between the base layer 44 and the perovskite compound, resulting in that a decrease in conversion efficiency is caused in some cases. This is caused because the internal stress caused by crystal growth is accumulated. In order to absorb this, a soft organic material is preferably used to form the base layer 44. When rearrangement of ions is performed by a heat treatment in particular, a further increase in internal stress due to a thermal expansion coefficient difference occurs, and thus the organic material is required as stress relaxation.

The protective layer 45 is provided between the electrode 3 and the active layer 41 as one of the intermediate layers. The protective layer 45 only needs to have a structure enabling exposure of a projection of an up and down structure formed on the surface of the active layer 41 in a polishing step. As a material applicable to the protective layer 45, there can be cited, for example, a halide, an inorganic oxide, an organic low-molecular material, a high-molecular material, and so on. When the protective layer 45 has carrier transportability, the protective layer 45 can be made to function as a buffer layer. In this case, a material applicable to the buffer layer 42 or the buffer layer 43 may be used for the protective layer 45.

Further, what is called a back contact system structure in which the electrode 2 and/or the buffer layer 42 and the electrode 3 and/or the buffer layer 43 are disposed separately from each other in one direction of the active layer 41 may be included.

Figure 6:
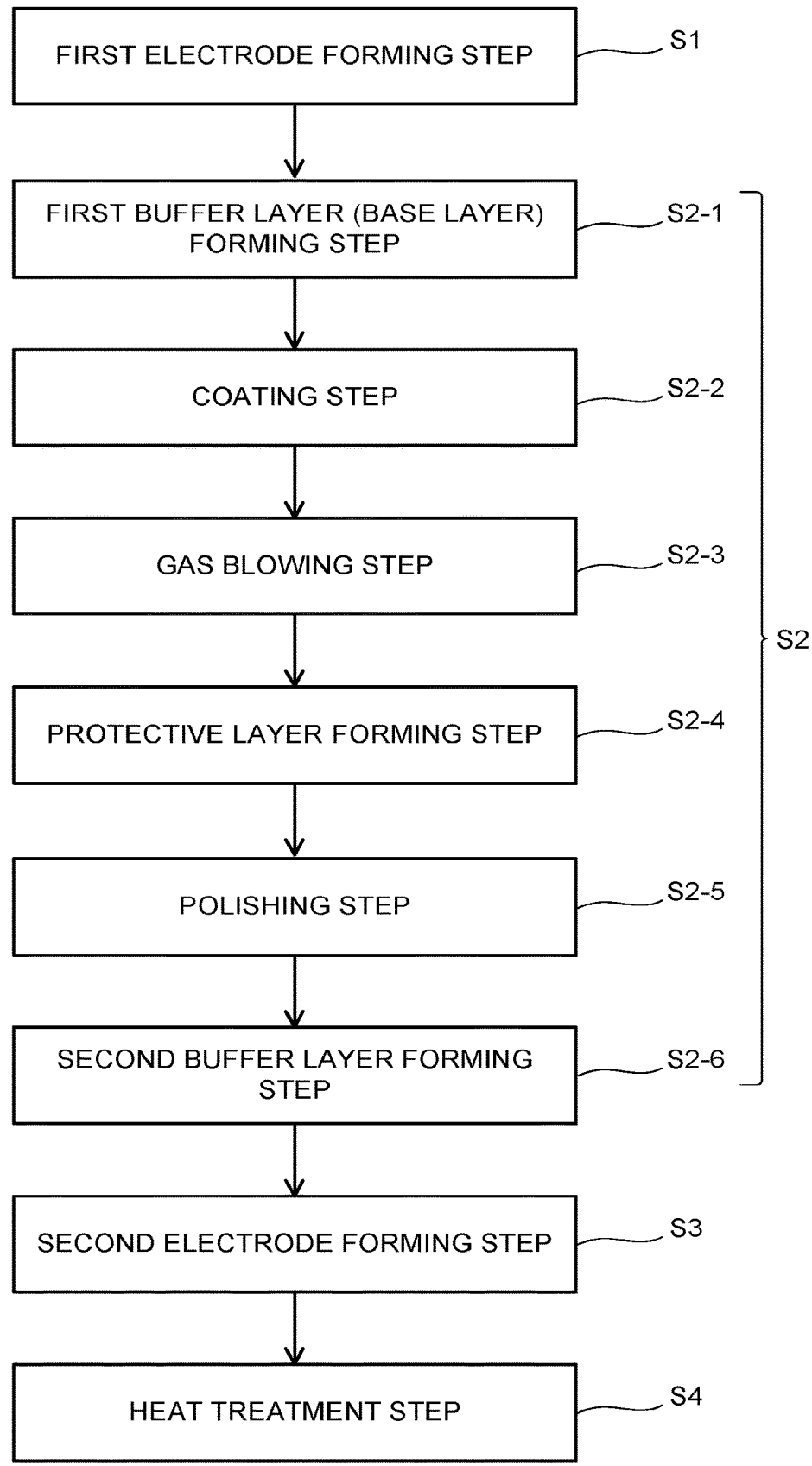
FIG. 6 is a flowchart for explaining a manufacturing method example of the photoelectric conversion element.

Next, there will be explained a manufacturing method example of the photoelectric conversion element according to the embodiment. FIG. 6 is a flowchart for explaining the manufacturing method example of the photoelectric conversion element according to the embodiment. The manufacturing method example of the photoelectric conversion element according to the embodiment includes a first electrode forming step S1, a photoelectric conversion layer forming step S2, a second electrode forming step S3, and a heat treatment step S4. The method of manufacturing the photoelectric conversion element according to the embodiment is not limited to the above-described manufacturing method example.

In the first electrode forming step S1, the electrode 2 is formed on the substrate 1 by using, for example, a vacuum deposition method, a sputtering method, an ion plating method, a plating method, a coating method, or the like.

In the photoelectric conversion layer forming step S2, the photoelectric conversion layer 4 is formed on the electrode 2. The photoelectric conversion layer forming step S2 includes a first buffer layer (base layer) forming step S2-1, a coating step S2-2, a gas blowing step S2-3, a protective layer forming step S2-4, a polishing step S2-5, and a second buffer layer forming step S2-6.

In the first buffer layer (base layer) forming step S2-1, at least one of the buffer layer 42 and the base layer 44 as the intermediate layer is formed on the electrode 2 by using, for example, a vacuum deposition method, a sputtering method, an ion plating method, a plating method, a coating method, or the like. The base layer 44 is preferably formed by using, for example, a coating method. When the buffer layer 42 and the base layer 44 are not formed, the first buffer layer (base layer) forming step S2-1 is not performed.

Figure 7:
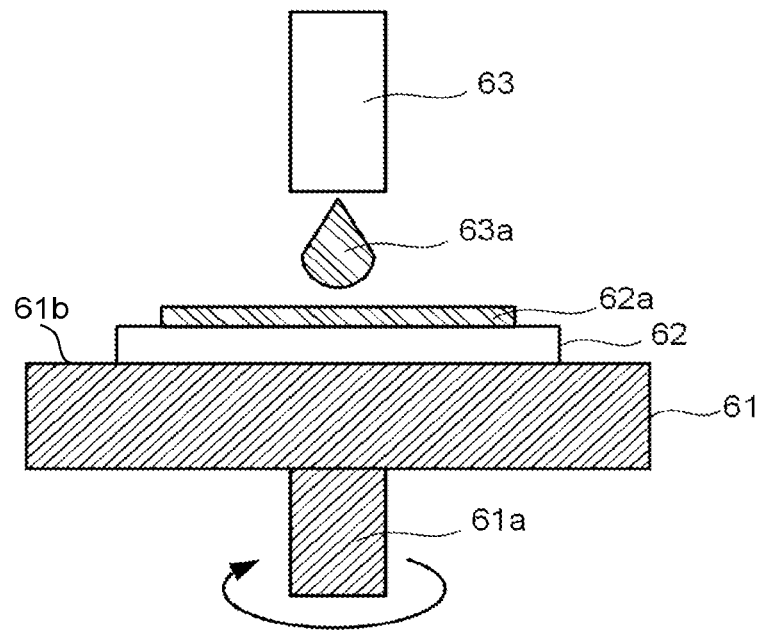
FIG. 7 is a schematic view for explaining an example of a coating step.

FIG. 7 is a schematic view for explaining the coating step S2-2. In the coating step S2-2, with use of a coating method, a coating solution 63a is applied onto an intermediate layer of a treatment object 62 disposed on a support 61 from a coater 63 to then form a coating layer 62a. The coating layer 62a may be formed using a coating apparatus including the coater 63. Supply of the coating solution 63a by the coater 63 is controlled by a controller provided separately.

The support 61 includes a rotation shaft 61a and a support surface 61b supporting the treatment object 62. The rotation shaft 61a is vertical to the support surface 61b. The support 61 fixes the treatment object 62 on the support surface 61b using a vacuum chuck. When forming the coating layer 62a, the support 61 rotates about the rotation shaft 61a.

The coating solution 63a contains a precursor of the perovskite compound and an organic solvent capable of dissolving the precursor. Examples of the organic solvent include N,N-dimethylformamide (DMF), γ-butyrolactone, dimethylsulfoxide (DMSO), and so on. A mixed solvent of a plurality of materials may be used as the organic solvent. The coating solution may contain a single solvent and a plurality of raw materials for forming the perovskite compound that are dissolved in the solvent.

A concentration of the precursor in the coating solution 63a is preferred to be 1770 mg/ml or less. When it becomes greater than 1770 mg/ml, a crystal grain diameter of the perovskite compound increases, to make pin holes or the like occur easily in the active layer 41 in the polishing step S2-5.

The coating layer 62a may be formed in a manner that, for example, a plurality of solutions individually containing a plurality of raw materials for forming the perovskite compound are prepared to be sequentially applied using a spincoater, a slit coater, a bar coater, a dip coater, or the like.

The coating solution 63a may further contain an additive. As the additive, for example, 1,8-diiodooctane (DIO), or N-cyclohexyl-2-pyrrolidone (CHP) is preferably used.

When the active layer 41 has a mesoporous structure generally, a leakage current between the electrodes can be suppressed even when pin holes, cracks, voids, or the like occur in the active layer 41. When the active layer 41 does not have a mesoporous structure, such an effect cannot be obtained easily. However, in this embodiment, when the plural raw materials are contained in the coating solution 63a as the precursor of the perovskite compound, less volume shrinkage occurs at the time of forming the active layer 41, thus making it possible to reduce pin holes, cracks, and voids.

By application of a solution containing methylammonium iodide (MAI), a metal halide, and the like after application of the coating solution 63a, reaction with the unreacted metal halide progresses, resulting in that a film with fewer pin holes, cracks and voids is obtained easily. Thus, a solution containing, for example, MAI is preferably applied on the surface of the coating layer 62a after application of the coating solution 63a. The MAI solution is preferably applied after the gas blowing step S2-3.

Figure 8:
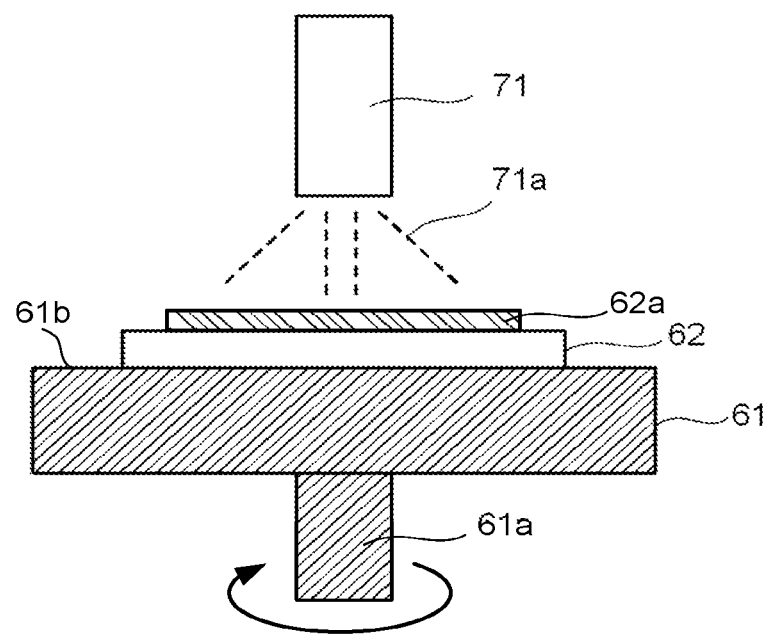
FIG. 8 is a schematic view for explaining an example of a gas supply step.

FIG. 8 is a schematic view for explaining the gas blowing step S2-3. In the gas blowing step S2-3, a gas 71a is blown onto the coating layer 62a from a gas supply 71 to then form the perovskite compound. The gas 71a may be blown onto the coating layer 62a using a coating apparatus including the gas supply 71. Supply of the gas 71a by the gas supply 71 is controlled by the controller provided separately.

As the gas 71a, for example, nitrogen, or helium, neon, or argon, which is classified as a rare gas, is preferably used. Further, as the gas 71a, air, oxygen, carbon dioxide, or the like can also be used. These gases can be used independently, or used by mixture. The nitrogen gas is preferred because it is inexpensive and can be used by separating from the atmosphere.

A concentration of moisture in the gas 71a is 50% or less, and preferred to be 4% or less. The lower limit value of the concentration of moisture in the gas 71a is preferred to be 10 ppm or more.

The gas 71a may contain vapor of a substance that is liquid at room temperature. As the substance liquid at room temperature, for example, N,N-dimethylformamide (DMF), γ-butyrolactone, dimethylsulfoxide (DMSO), chlorobenzene (CB), dichlorobenzene (DCB), or the like can be used. The vapor of the substance liquid at room temperature can improve smoothness of the active layer 41 and improve stability of the perovskite compound.

A temperature of the gas 71a is preferred to be 30° C. or less. When it becomes greater than 30° C., solubility of the precursor of the perovskite compound contained in the coating solution 63a increases to then hinder formation of the perovskite compound. In the meantime, a temperature of the treatment object 62 (substrate temperature) is preferably lower than that of the gas. The temperature of the treatment object 62 is preferred to be, for example, 20° C. or less, and further preferred to be 15° C. or less.

Blowing the gas 71a removes the organic solvent during a process of the perovskite compound being formed, and enables acceleration of the forming reaction of the perovskite compound. Blowing the gas 71a accelerates the forming reaction of the perovskite compound even without application of heat, and thus it is possible to suppress formation of pin holes, cracks, or voids in the active layer 41. Further, with no application of heat, rapid drying of the surface of the coating layer 62a is suppressed, to enable suppression of a stress difference between the coating surface and the inside. Therefore, the surface smoothness of the active layer 41 to be formed increases, to enable an improvement in the fill factor FF and an improvement in operating life.

The gas blowing needs to be performed before the forming reaction of the perovskite compound is completed in the coating solution 63a. That is, it is necessary to accelerate the reaction by the gas blowing. The gas blowing is preferably started immediately after the coating layer 62a is formed. Specifically, it is preferably started within 10 seconds, and more preferably started within one second after the coating is completed.

During a process of the coating layer 62a drying, single crystals of MAI, lead iodide, and the like, which are the raw materials, also grow simultaneously with the formation of the perovskite compound in some cases. As the raw materials are allowed to dry more quickly from the state where they are dissolved and dispersed in the coating layer 62a, the perovskite compound is allowed to grow more efficiently. Accordingly, the manufacturing method example of the photoelectric conversion element according to the embodiment is effective when the perovskite compound is formed on an organic film or an oxide having a large lattice mismatch.

When the ratio of the conductive high-molecular compound to be used for the electrode or the like decreases relatively, the coating solution 63a containing the precursor of the perovskite compound is likely to be repelled due to the effect of surface energy. This facilitates occurrence of pin holes in the active layer 41. In such a case, by blowing a nitrogen gas or the like, drying of the solvent is preferably completed before the coating solution 63a is repelled.

Progress of the reaction can be observed by measuring an absorption spectrum of the coating layer 62a. That is, with the perovskite compound being formed, light transmittance of the coating layer 62a decreases. Therefore, visual observation reveals that the coating is changing in color to brown as the reaction progresses. For the purpose of quantitatively observing such a color change, the absorption spectrum of the coating is measured. When such an observation is performed, it is preferred to measure an absorption spectrum of a wavelength that is unlikely to be affected by absorptions of the raw materials contained in the coating solution 63a and facilitates observation of absorption by the perovskite compound. Specifically, the absorption spectrum of a wavelength in a region of 700 to 800 nm is preferably measured.

No absorption spectrum measurement is required to be performed in this entire region, and thus an absorption spectrum of a specific wavelength, for example, 800 nm, only needs to be observed. The absorption spectrum is measured by using, for example, visible and ultraviolet spectroscopy (UV-VIS) or the like, but the method is not limited in particular. As a light source, a deuterium discharge tube, a tungsten lump, or a xenon lump can be used, and a spectroscope, a detector, and the like are combined to perform the measurement.

The absorption spectrum can be measured with a transmitted light at the coating stage of the coating solution 63a when the substrate 1, the electrode 2, and the like are transparent. In the meantime, in the case of no sufficient transparency, a reflected light on the coating surface is observed, thereby enabling the measurement.

When the coating solution 63a containing the precursor of the perovskite compound is in contact with a layer containing the organic material, which is, for example, the electrode 2, the buffer layer 42, or the base layer 44, a period of time for the gas blowing is preferred to be 45 seconds or more, and more preferred to be 120 seconds or more.

A flow rate of the gas 71a is preferred to be, for example, 3 L/minute or more and 20 L/minute or less. As the flow rate of the gas flowing on the coating surface is larger, the progress of the forming reaction of the perovskite compound is accelerated. Further, the flow rate of the gas is preferred to be small in order to prevent fluctuations of the coating surface due to the gas flow.

The gas supply 71 blows the gas through a nozzle having a gas blowing port, and a leading end of the nozzle is preferably directed to the coating surface, and further the leading end of the nozzle is preferably close to the surface of the coating layer 62a.

After the gas blowing, the coating solution containing the precursor of the perovskite compound may be applied a plurality of times. The coating solution is applied using, for example, a spincoater, a slit coater, a bar coater, a dip coater, or the like. A coating layer formed by the first application tends to be a lattice mismatched layer, and thus the coating solution is preferably applied so as to have a relatively thin thickness. Specifically, such conditions as to reduce the film thickness are preferred in which a rotation speed of the spincoater is relatively fast, a slit width of the slit coater and the bar coater is relatively narrow, a pulling-up speed of the dip coater is relatively fast, a solute concentration in the coating solution is relatively weak, and the like.

In a two-step method or a conventional method called a sequential deposition method or the like, the gas blowing is sometimes performed after the forming reaction of the perovskite compound is completed, namely after sufficient color development occurs due to the reaction. However, this is just performed for drying the solvent component. The gas blowing is effective in the photoelectric conversion element that includes the base layer 44 having a mesoporous structure and made of titanium oxide, aluminum oxide, or the like because the gas blowing facilitates crystallization of the perovskite compound. However, the gas blowing is less effective for the forming reaction of the perovskite compound on the organic film and the oxide having a large lattice mismatch other than the above. When the perovskite compound is formed on the organic film or the oxide having a large lattice mismatch, as described in the embodiment, before the forming reaction of the perovskite compound is completed, the gas is blown to accelerate the forming reaction of the perovskite compound. Thereby, it is possible to achieve suppression of a defect structure such as pin holes, cracks, or voids. The gas blowing performed when applying a certain material before forming a perovskite structure is very effective for the subsequent forming reaction of the perovskite structure on the organic film or the oxide having a large lattice mismatch.

After the gas blowing, a heat treatment is preferably performed in order to dry the solvent (a heat treatment step S2-3-2). The heat treatment is performed by a heater. The heat treatment is performed for removing the organic solvent contained in the coating layer 62a, to thus be performed preferably before the buffer layer 43 and the like are formed. A heat treatment temperature is preferred to be 50° C. or more, and further preferred to be 90° C. or more, and its upper limit is preferred to be 200° C. or less, and further preferred to be 150° C. or less. The heat treatment is performed at such a temperature. The case when the heat treatment temperature is low has a problem of being incapable of removing the solvent sufficiently, and the case when the heat treatment temperature is too high has a problem that the surface of the active layer 41 becomes rough to make it impossible to obtain a smooth surface.

In the protective layer forming step S2-4, the protective layer 45 as one of the intermediate layers is formed on the coating layer 62a using, for example, a vacuum deposition method, a sputtering method, an ion plating method, a plating method, a coating method, or the like. At this time, a bulge (projection) of the coating layer 62a may penetrate the protective layer 45 to be exposed.

Figure 9:
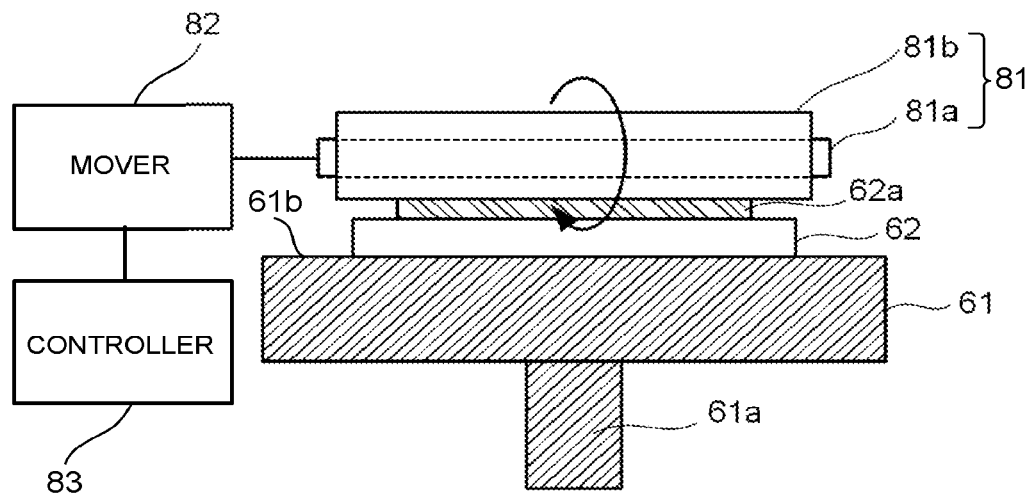
FIG. 9 is a schematic view for explaining an example of a polishing step.

FIG. 9 is a schematic view for explaining the polishing step S2-5. In the polishing step S2-5, the surface of the treatment object 62 is polished using a polishing roller 81. The polishing roller 81 is movable by a mover 82. The mover 82 is controlled by a controller 83. The polishing is performed for smoothing the surface of the treatment object 62. Such polishing as to expose only the projection on the surface of the coating layer 62a is preferably performed after the protective layer 45 is formed in particular.

An abrasive is used for the polishing by the polishing roller 81. As the abrasive, there can be used, for example, brown fused alumina abrasives, white fused alumina abrasives, rudy fused alumina abrasives, mono-crystalline fused alumina abrasives, artificial emery abrasives, fused alumina zirconia abrasives, black silicon carbide abrasives, green silicon carbide abrasives, or the like, which are described in JIS R6111. As the grain size of fine powder for polishing, there can be used #240, #280, #320, #360, #400, #500, #600, #700, #800, #1000, #1200, #1500, #2000, #2500, #3000 or the like, which is described in JIS R6001. Further, a nonwoven fabric, a sponge of polyvinyl alcohol, or the like can be used.

The polishing roller 81 includes a rotation shaft 81a and a polishing surface 81b for polishing the surface of the treatment object 62 by rotating about the rotation shaft 81a. At the time of polishing, the mover 82 moves at least one of the polishing roller 81 and the treatment object 62 so that the surface of the treatment object 62 comes into contact with the polishing surface 81b of the polishing roller 81 parallel to the rotation shaft 81a. This makes it difficult for flaws to be caused in the treatment object 62, or for wastes from the polishing to remain. FIG. 9 illustrates an example where the mover 82 moves the polishing roller 81. The polishing roller 81 may be moved along one direction parallel to the support surface 61b while rotating.

Figure 10:
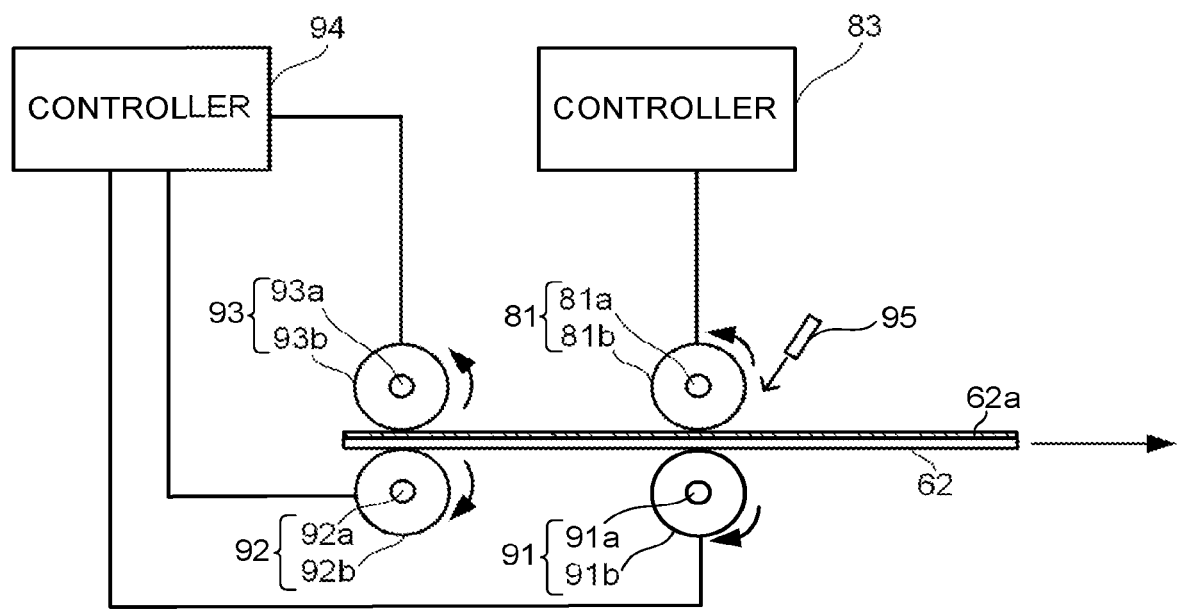
FIG. 10 is a schematic view for explaining another example of the polishing step.

The treatment object 62 may be polished while being moved by a roll-to-roll process. FIG. 10 is a schematic view for explaining another example of the polishing step S2-5. In the case of a configuration illustrated in FIG. 10, the position of the polishing roller 81 may be fixed. In this case, the mover 82 does not need to be provided.

A support 91 illustrated in FIG. 10 includes a rotation shaft 91a parallel to the rotation shaft 81a and a support surface 91b supporting the treatment object 62 while rotating about the rotation shaft 91a. A support 92 includes a rotation shaft 92a parallel to the rotation shaft 81a and a support surface 92b supporting the treatment object 62 while rotating about the rotation shaft 92a. A support 93 includes a rotation shaft 93a parallel to the rotation shaft 81a and a support surface 93b supporting the treatment object 62 while rotating about the rotation shaft 93a. The positions of the supports 91 to 93 may be fixed.

The support 91 rotates in the same rotation direction as that of the support 92, and rotates in a rotation direction reverse to that of the polishing roller 81 and the support 93. The supports 92 and 93 are controlled by a controller 94. The support 91 is controlled by a controller provided separately or the controller 94. The treatment object 62 is transferred along one direction by the support 91 to the support 93.

The controllers such as the controller 83 and the controller 94 are configured by using hardware using a processor and the like, for example. Each operation may be stored as an operating program in a computer-readable recording medium such as a memory, and each operation may be executed by the hardware reading the operating program stored in the recording medium as required.

The rotation shafts 91a to 93a extend in a direction parallel to the rotation shaft 81a. The supports 91 to 93 are each controlled by the controller 94 so as to rotate at a rotation speed slower than that of the polishing roller 81, thereby enabling polishing while the treatment object 62 moving. Wastes generated by the polishing are removed by a cleaning device 95. The cleaning device 95 using a gas blow is preferred.

In the second buffer layer forming step S2-6, the buffer layer 43 is formed on the protective layer 45 by using, for example, a vacuum deposition method, a sputtering method, an ion plating method, a plating method, a coating method, or the like. When the buffer layer 43 is not provided, the second buffer layer forming step S2-6 is not performed.

In the second electrode forming step S3, the electrode 3 is formed on the photoelectric conversion layer 4 by using, for example, a vacuum deposition method, a sputtering method, an ion plating method, a plating method, a coating method, or the like.

In the heat treatment step S4, in order to heat the treatment object 62, for example, the heater performs the heat treatment on a stack including the substrate 1, the electrode 2, the electrode 3, and the photoelectric conversion layer 4. In this manner, a semiconductor element can be manufactured.

The heat treatment enables rearrangement of ions in the perovskite compound having strain formed by the polishing. The ions in the perovskite compound may be rearranged by voltage application in place of the heat treatment. A heat treatment temperature is preferred to be 50° C. or more, and further preferred to be 90° C. or more, for example. The heat treatment temperature is preferred to be 200° C. or less, and further preferred to be 150° C. or less. The case when it is less than 50° C. requires time for rearrangement. The case when it becomes greater than 200° C. has a problem that the surface of the coating layer 62a becomes rough and does not obtain smoothness. In the case of no rearrangement, the conversion efficiency becomes lower than before the polishing. This is because carrier transfer efficiency is poor and FF and $J_{SC}$ decrease. The method of manufacturing the photoelectric conversion element according to this embodiment is suitable also for the case of manufacturing a planar photoelectric conversion element with no base layer 44.

The respective steps of the above-described manufacturing method example are performed using, for example, an apparatus for manufacturing the photoelectric conversion element. The apparatus for manufacturing a semiconductor element includes the support 61 and the coater 63 that are illustrated in FIG. 7, the gas supply 71 illustrated in FIG. 8, and the polishing roller 81, the mover 82, and the controller 83 that are illustrated in FIG. 9, for example. Further, the manufacturing apparatus may include the configuration illustrated in FIG. 10. The apparatus for manufacturing the semiconductor element may further include a mechanism for forming the electrodes 2 and 3, a mechanism for forming each of the buffer layers 42 and 43, the base layer 44, and the protective layer 45, and a heater that heats the stack including the electrodes 2 and 3 and the photoelectric conversion layer 4.

EXAMPLE

The photoelectric conversion element utilizing the perovskite compound has been evaluated using a small element with a power generation area of about 2 mm square. The element utilizing the perovskite compound is fabricated by deposition accompanied by crystal growth and has internal stress generated therein due to volume shrinkage, and thus has a problem of occurrence of pin holes and causing interlayer peeling and the like. Thus, it was difficult to fabricate a layer structure with few structure defects. For this reason, in places of mass production, conversion efficiency reproducibility was low and variations were large. For this reason, there was sometimes a case that a high conversion efficiency was able to be obtained unusually in some products having few defects accidentally, but it was difficult to obtain a high conversion efficiency uniformly on a broad basis.

In the meantime, it is necessary to manufacture an element allowing achievement of high efficiency on a broader basis for practical application. Therefore, in the following examples, elements each having a power generation area of 1 cm square were manufactured, and their comparison and examination were performed. A solar cell fabricated by coating is normally fabricated in which strip-shaped cells each having a width of about 1 cm are configured in series. Therefore, the element with a 1-cm square power generation area has an appropriate size to be an index of actual module performance.

Example 1

An ITO film as a first electrode was formed on a glass substrate. A base layer containing PEDOT was formed on the ITO film. The base layer functions also as the hole transport layer. The PEDOT being PSS was dried at 140° C. for 10 minutes after HIL 1.1 was spin-coated at 5000 rpm. Then, a coating layer containing a precursor of perovskite made of methylammonium iodide and lead iodide was formed. A coating solution containing a precursor of a perovskite compound was prepared by dissolving methylammonium iodide and lead iodide in DMF. At this time, the methylammonium iodide was adjusted to be 200 mg/ml, and the lead iodide was adjusted to be 578 mg/ml. This solution was spin-coated onto the base layer at 500 rpm.

After the coating, gas blowing was started before a change in color, and then the blowing was stopped after confirma tion of appearance of a change in color. A nitrogen gas was used for the gas, and was blown through a nozzle having a 6-mm inside diameter at 5 L/minute (40 km/l). The nozzle was disposed so that the center of the nozzle was located on the normal of a center portion of the glass substrate, and a distance from the nozzle to the substrate was set to 0.5 cm. The blowing was performed for 120 seconds.

A solution was prepared in which PCBM was dissolved in DCB so as to have a PCBM concentration of 20 mg/ml, and was spin-coated onto an active layer fabricated using the coating layer at 400 rpm for 120 s. During this period, nitrogen was introduced into a spincoater to accelerate drying. Then, the surface was polished using a Bellclean E-1 (manufactured by AION Co., Ltd.). After completion of the polishing, the PCBM was spin-coated again under the same condition to fabricate a sample. Further, a sample obtained after the PCBM was spin-coated under the same condition without polishing was fabricated separately.

Figure 11:
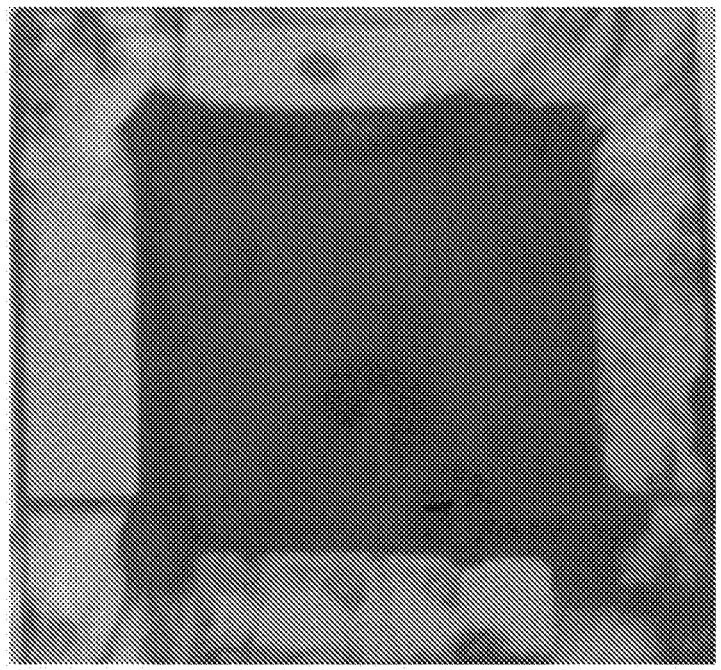
FIG. 11 is a photograph of a surface of a sample of an example.
Figure 12:
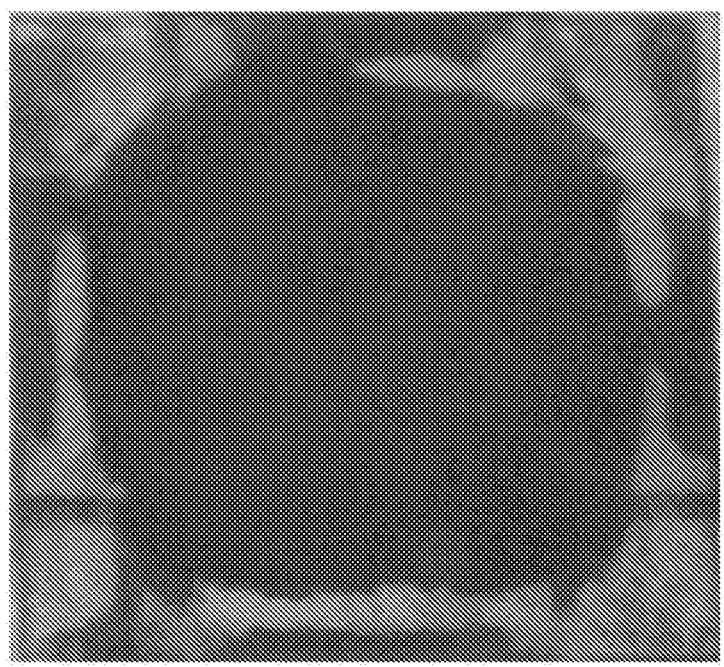
FIG. 12 is a photograph of a surface of a sample of an example.

FIG. 11 is a photograph of the sample with no polishing, and FIG. 12 is a photograph of the sample on which polishing was performed. The sample shown in FIG. 11 has spots on its surface. They did not disappear even after two coatings of the PCBM. The sample shown in FIG. 12 has no spots. It is found out that performing polishing makes it possible to remove the spots by the second coating even though there exist spots on the surface after the first coating. That is, it is possible to coat an exposed portion of the active layer.

BCP was deposited on the substrate having had up to the PCBM applied thereon by vacuum deposition. The PCBM layer and the BCP layer function as the buffer layer functioning as the electron transport layer. Then, an Ag layer as a second electrode was formed on the buffer layer by a vacuum deposition method. Then, a heat treatment was performed at 70° C. and a photoelectric conversion element of Example 1 was fabricated. In Example 1, the conversion efficiency was measured while changing the heat treatment time to zero minute, three minutes, 18 minutes, 33 minutes, 78 minutes, 93 minutes, and 285 minutes.

Figure 13:
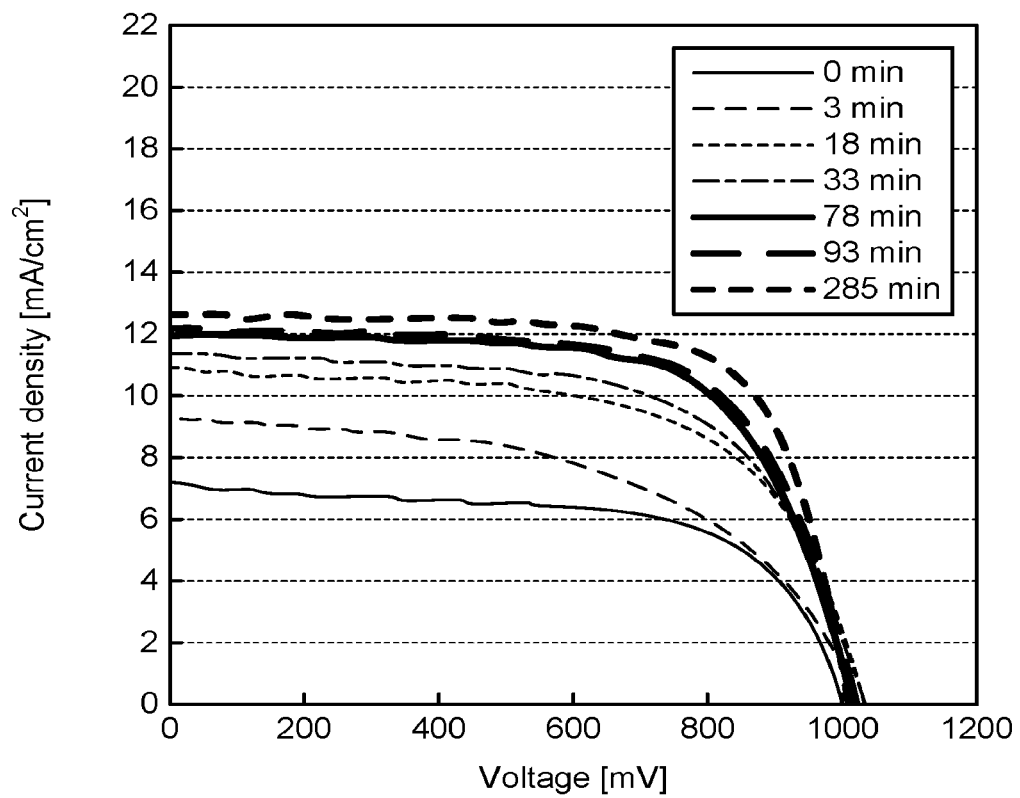
FIG. 13 is a chart illustrating IV characteristics of the photoelectric conversion element.
Figure 14:
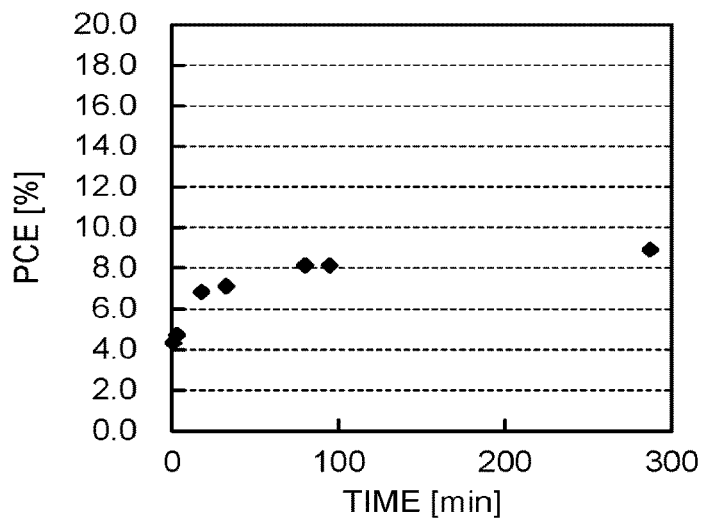
FIG. 14 is a chart illustrating a conversion efficiency PCE of the photoelectric conversion element.
Figure 15:
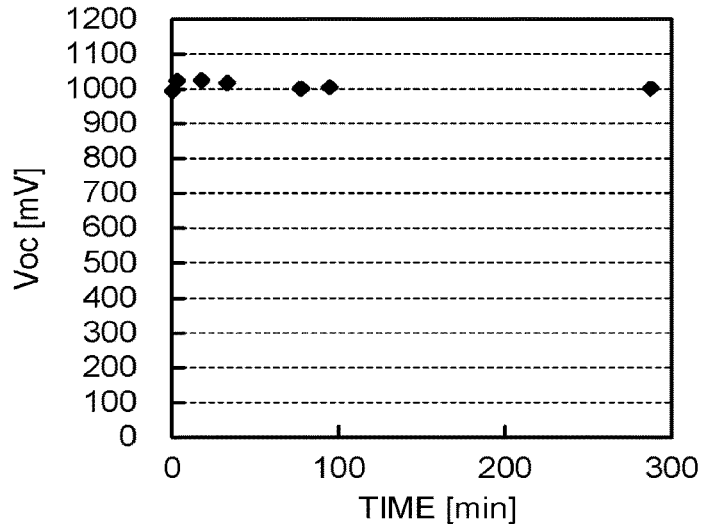
FIG. 15 is a chart illustrating an open-circuit voltage $V_{OC}$ of the photoelectric conversion element.
Figure 16:
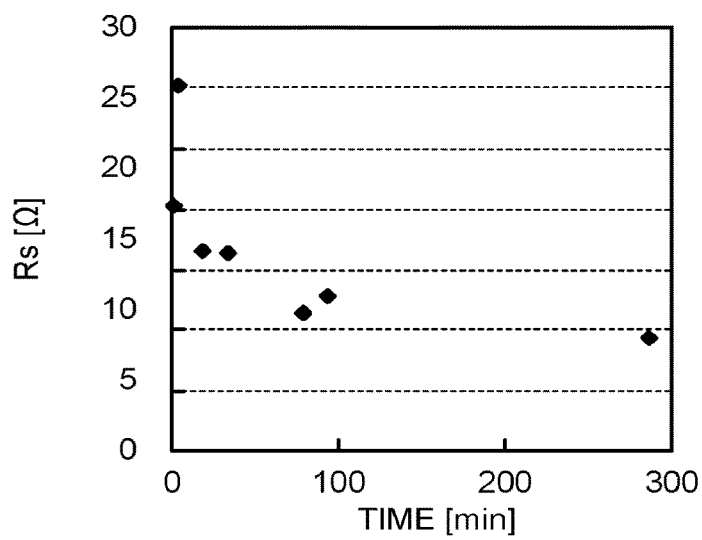
FIG. 16 is a chart illustrating an interface resistance Rs of the photoelectric conversion element.
Figure 17:
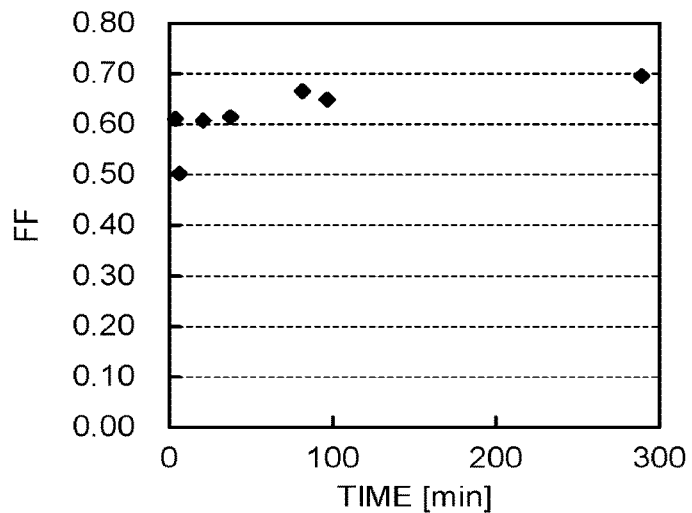
FIG. 17 is a chart illustrating a fill factor FF of the photoelectric conversion element.
Figure 18:
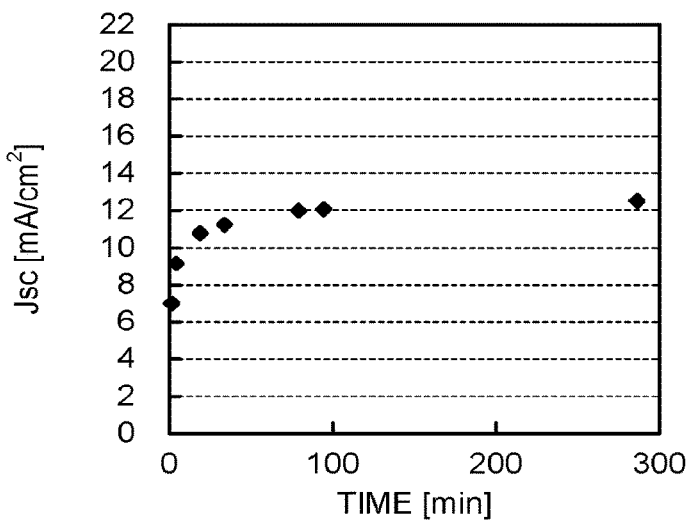
FIG. 18 is a chart illustrating a short-circuit current density $J_{SC}$ of the photoelectric conversion element.
Figure 19:
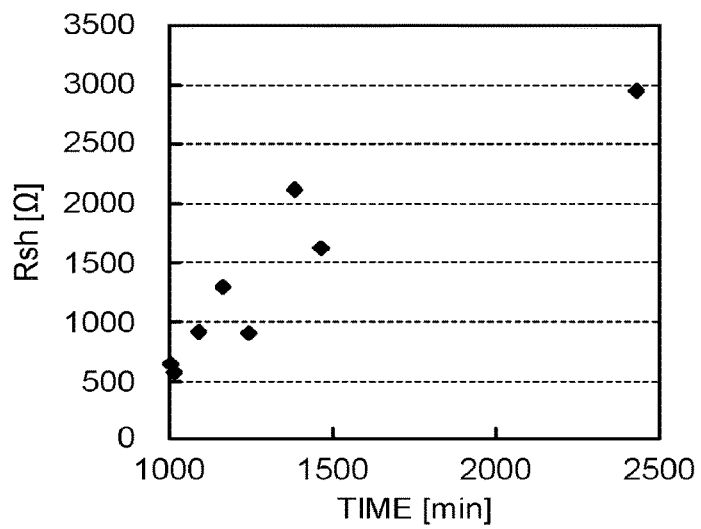
FIG. 19 is a chart illustrating a parallel resistance Rsh of the photoelectric conversion element.

IV characteristics when a solar simulator irradiated each of the photoelectric conversion elements with light of AM 1.5 under the condition of 1000 W/m² were measured. FIG. 13 is a chart illustrating the IV characteristics of the photoelectric conversion elements. Table 1 is a table illustrating relations between heat treatment times and respective parameters (open-circuit voltage $V_{OC}$, short-circuit current density $J_{SC}$, maximum output Pmax, fill factor FF, conversion efficiency PCE, parallel resistance Rsh, and interface resistance Rs). FIG. 14 is a chart illustrating the conversion efficiency PCE, FIG. 15 is a chart illustrating the relation with the open-circuit voltage $V_{OC}$, FIG. 16 is a chart illustrating the interface resistance Rs, FIG. 17 is a chart illustrating the fill factor FF, FIG. 18 is a chart illustrating the short-circuit current density $J_{SC}$, and FIG. 19 is a chart illustrating the parallel resistance Rsh. For example, the sample with the conversion efficiency of 4.48% improved as the heat treatment time elapsed, and reached about twice the performance of the initial conversion efficiency, which was 8.97% of the conversion efficiency. Further, $J_{SC}$ and FF changed greatly as compared to $V_{OC}$.

TABLE 1

| | TIME (min) | | | | | | |
|---|---|---|---|---|---|---|---|
| | 0 | 3 | 18 | 33 | 78 | 93 | 285 |
| $V_{OC}$ (mV) | 1006 | 1031 | 1031 | 1029 | 1011 | 1017 | 1010 |
| Jsc (mA/cm²) | 7.2 | 9.3 | 10.9 | 11.3 | 12.1 | 12.2 | 12.6 |
| Pmax (mW) | 4.48 | 4.93 | 6.92 | 7.28 | 8.22 | 8.19 | 8.97 |
| FF | 0.62 | 0.51 | 0.62 | 0.62 | 0.67 | 0.66 | 0.70 |
| PCE (%) | 4.48 | 4.93 | 6.92 | 7.28 | 8.22 | 8.19 | 8.97 |
| Rsh (Ω) | 664 | 588 | 926 | 1324 | 2129 | 1646 | 2977 |
| Rs (Ω) | 20.6 | 30.4 | 16.8 | 16.6 | 11.6 | 13.0 | 9.5 |

Figure 20:
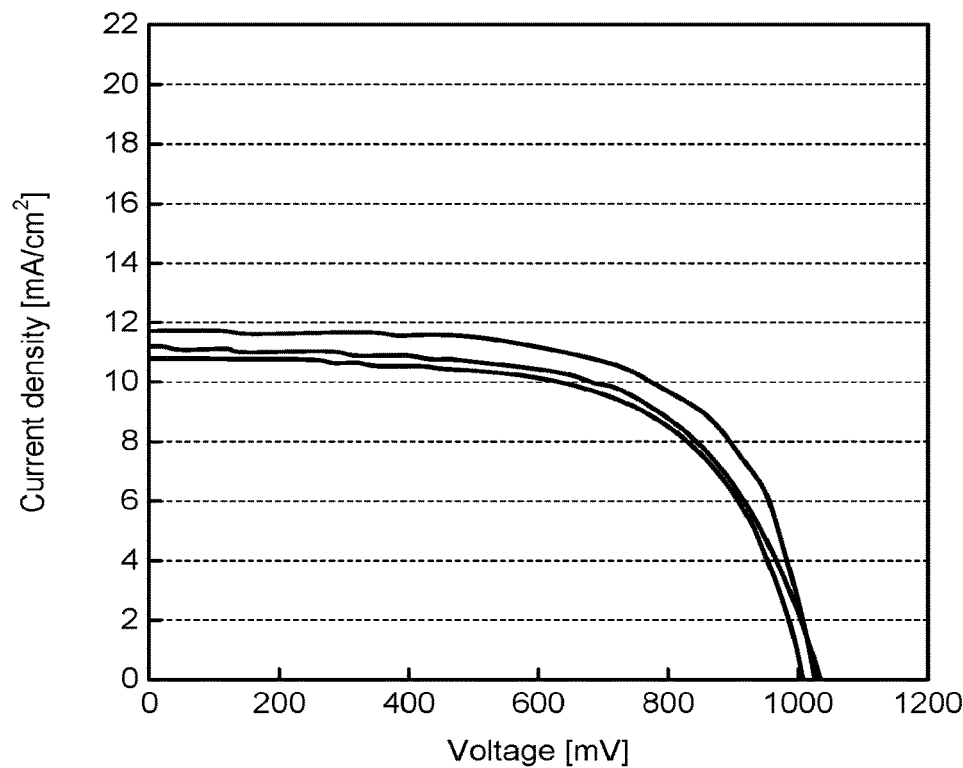
FIG. 20 is a chart illustrating IV characteristics of the photoelectric conversion element.

Table 2 is a table illustrating reproducibility of the respective parameters of the photoelectric conversion elements, and FIG. 20 is a chart illustrating reproducibility of the respective parameters of the photoelectric conversion elements. In Example 1, samples A, B, and C were fabricated by the above-described steps including the polishing step. Table 2 reveals that by performing the polishing, a variation in conversion efficiency falls within a range of 0.82 points within one batch. This makes it possible to confirm that the photoelectric conversion element has high reproducibility.

TABLE 2

| | SAMPLE No. | | |
|---|---|---|---|
| | A | B | C |
| $V_{OC}$(mV) | 1022 | 1007 | 1031 |
| Jsc(mA/cm²) | 11.8 | 10.8 | 11.2 |
| Pmax(mW) | 7.81 | 6.92 | 7.15 |
| FF | 0.65 | 0.64 | 0.62 |
| PCE(%) | 7.81 | 6.92 | 7.15 |
| Rsh(Ω) | 2299 | 2028 | 1230 |
| Rs(Ω) | 12.3 | 13.3 | 19.9 |

Example 2

Figure 21:
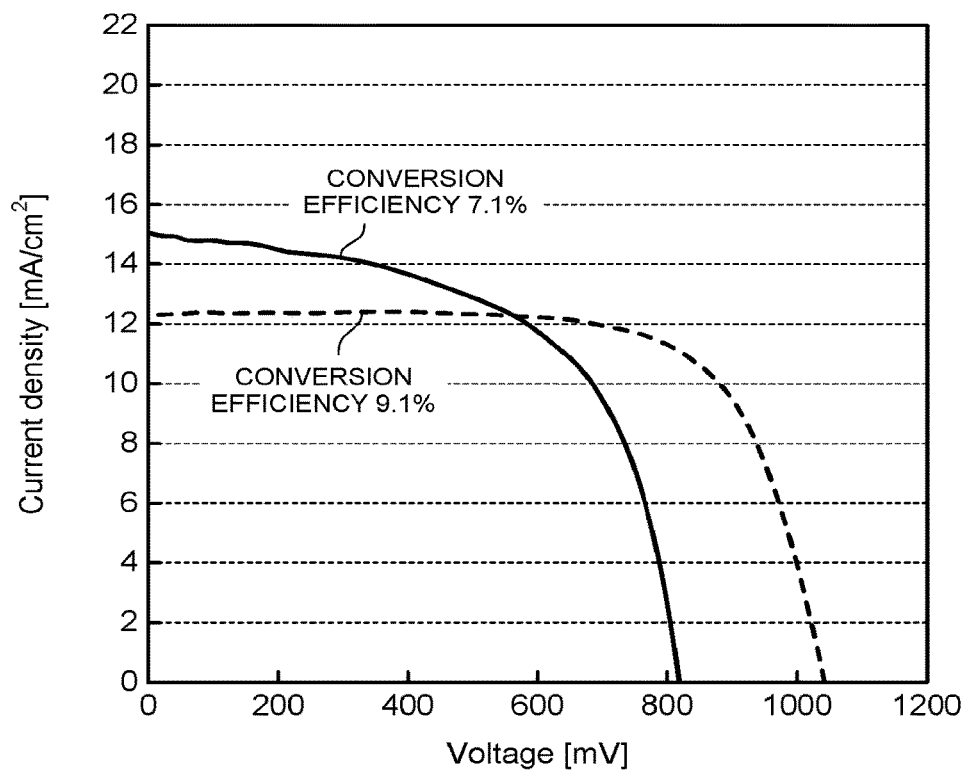
FIG. 21 is a chart illustrating IV characteristics of the photoelectric conversion element.
Figure 22:
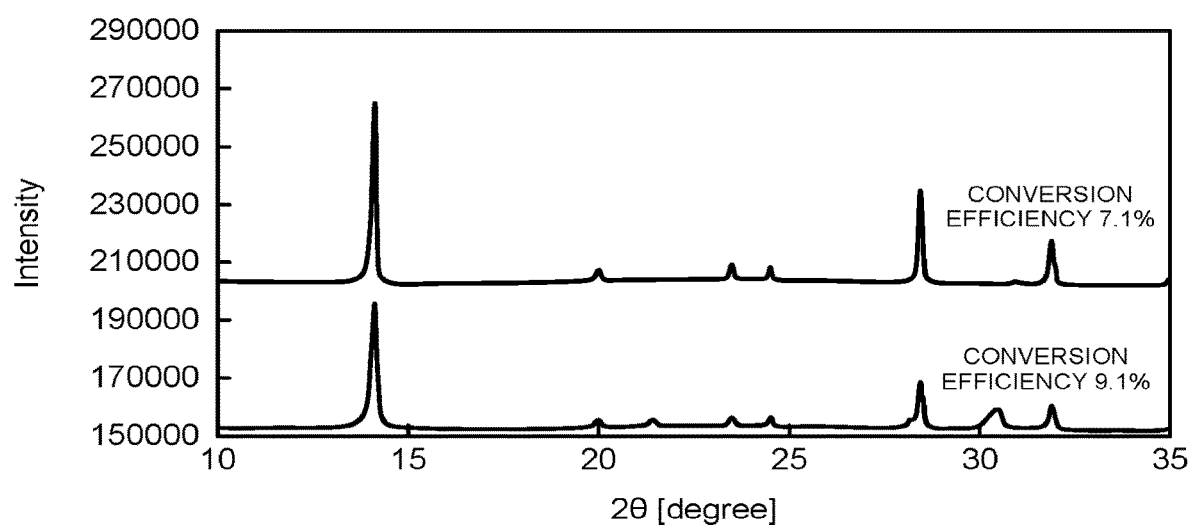
FIG. 22 is a view illustrating XRD diffraction patterns.
Figure 23:
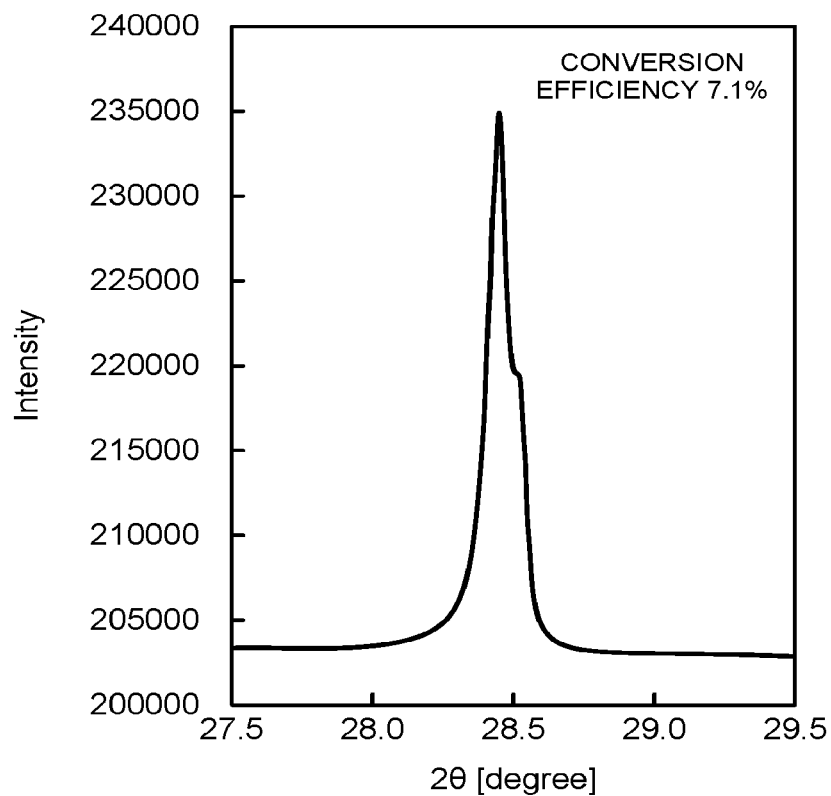
FIG. 23 is an enlarged view illustrating the XRD diffraction pattern.
Figure 24:
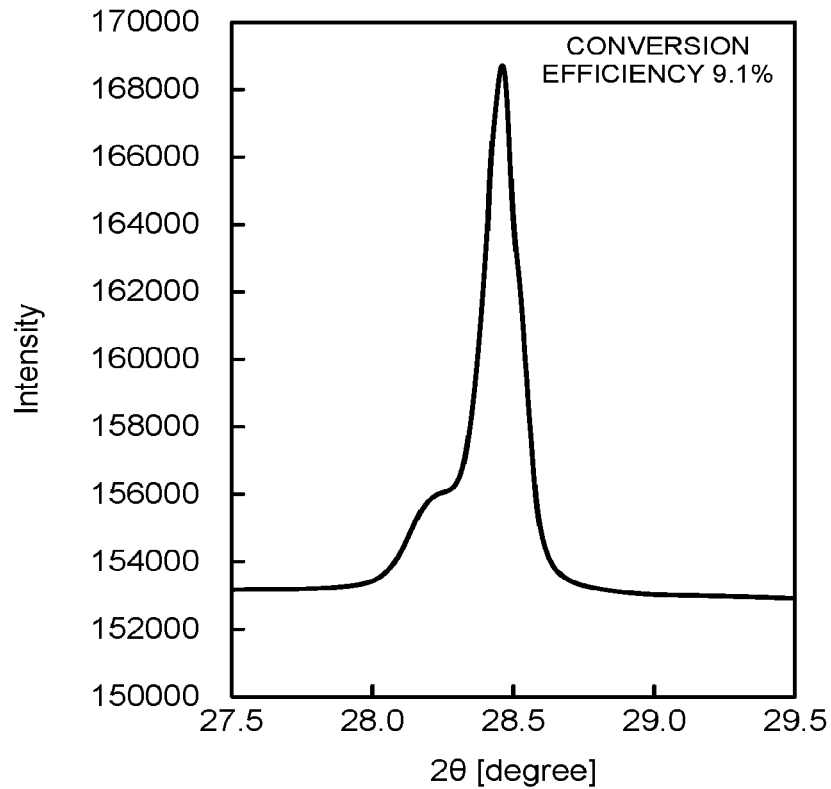
FIG. 24 is an enlarged view illustrating an example of the XRD diffraction pattern.

IV measurement and XRD measurement were performed on a sample with the conversion efficiency of 9.1% that underwent up to the polishing and the heat treatment by the steps similar to those in Example 1 and a sample with the conversion efficiency of 7.1% that did not undergo the polishing. A sample for the XRD measurement was fabricated separately from the photoelectric conversion element. The same manufacturing steps as those in Example 1 were performed without deposition of BCP and Ag. Obtained IV characteristics of the photoelectric conversion elements are illustrated in FIG. 21, X-ray diffraction patterns are illustrated in FIG. 22, and a partially enlarged view of FIG. 22 is illustrated in FIG. 23 and FIG. 24. FIG. 23 and FIG. 24 reveal that by performing the polishing, the diffraction pattern has a diffraction peak of (004) of the perovskite compound. This diffraction peak is detected by single crystal XRD, but is not easily detected in the element. This is conceivably because by performing the polishing, the crystal structure of the perovskite compound is once strained, but is rearranged by the heat treatment or the like, and thereby an ideal crystal structure from which effects of the deposition process are eliminated is formed. At this time, the ratio of the maximum intensity of the diffraction peak of (004) to the maximum intensity of the diffraction peak of (220) was 0.18. It is possible to say that as the intensity is higher, a more excellent crystal can be obtained.

Example 3

Figure 25:
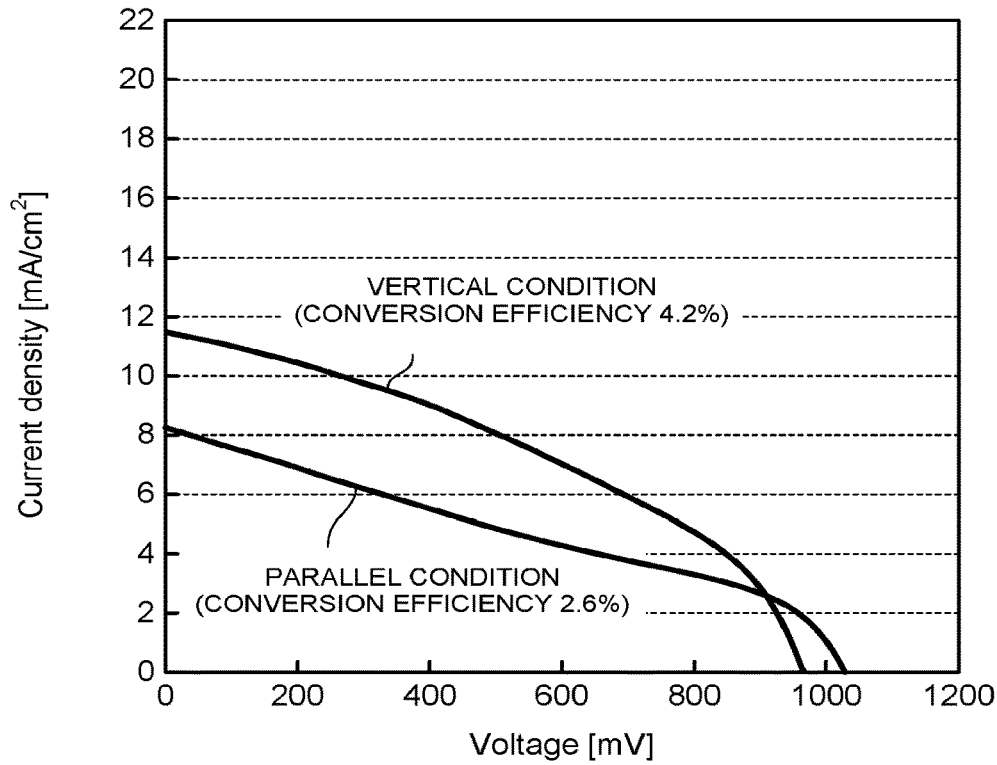
FIG. 25 is a chart illustrating IV characteristics of the photoelectric conversion element.
Figure 26:
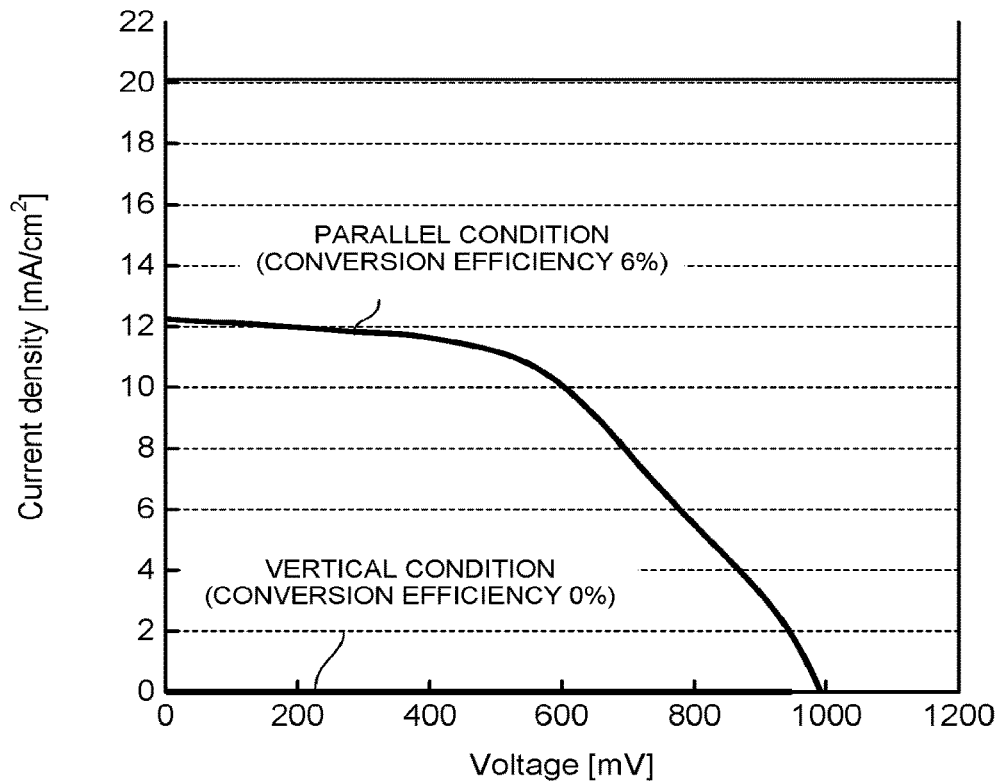
FIG. 26 is a chart illustrating IV characteristics of the photoelectric conversion element.

Effects of the heat treatment were compared while changing the direction of polishing. The operations were performed similarly to Example 1 except the conditions of polishing, and a comparison was made between a condition that the rolling shaft of the polishing roller is vertical to the surface of the coating layer and a condition that the rolling shaft of the polishing roller is parallel to the surface of the coating layer. IV characteristics of these are illustrated in FIG. 25 and FIG. 26. FIG. 25 is a chart illustrating the IV characteristics of samples before the heat treatment, and FIG. 26 is a chart illustrating the IV characteristics of the samples after the heat treatment. As is clear from FIG. 25, before the heat treatment, the conversion efficiency is high under the vertical condition, but after the heat treatment, the conversion efficiency is high under the parallel condition. In FIG. 26, the conversion efficiency under the parallel condition exceeded the conversion efficiency under the vertical condition before the heat treatment. This is conceivably because under the vertical condition, a separated perovskite compound damaged a normal perovskite compound and the direction of load applying to the coating layer was not a constant direction, thus making it difficult to obtain a rearrangement effect of ions by the heat treatment. It is conceived that under the parallel condition, combining with a cleaning device such as a gas blow also enables removal of the separated perovskite compound from the polished surface and a load in a surface direction to apply to the coating layer is also aligned in a constant direction, thus making it easy to obtain the rearrangement effect.

Example 4

Figure 27:
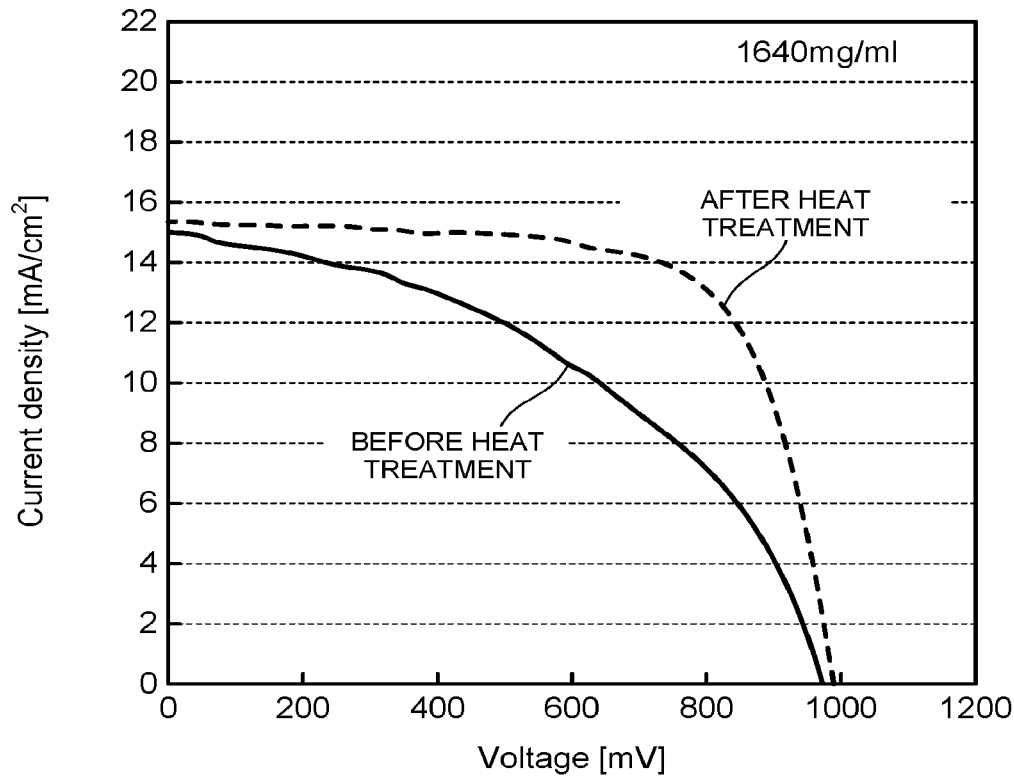
FIG. 27 is a schematic chart illustrating a structure example of the photoelectric conversion element.
Figure 28:
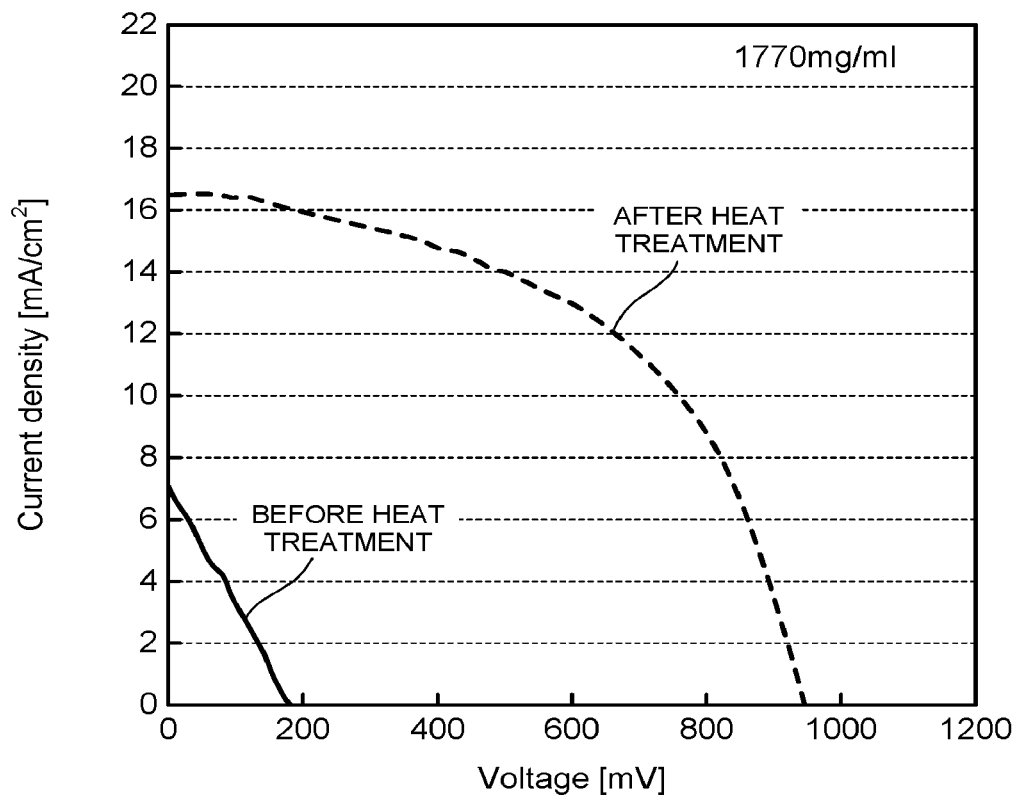
FIG. 28 is a chart illustrating IV characteristics of the photoelectric conversion element.
Figure 29:
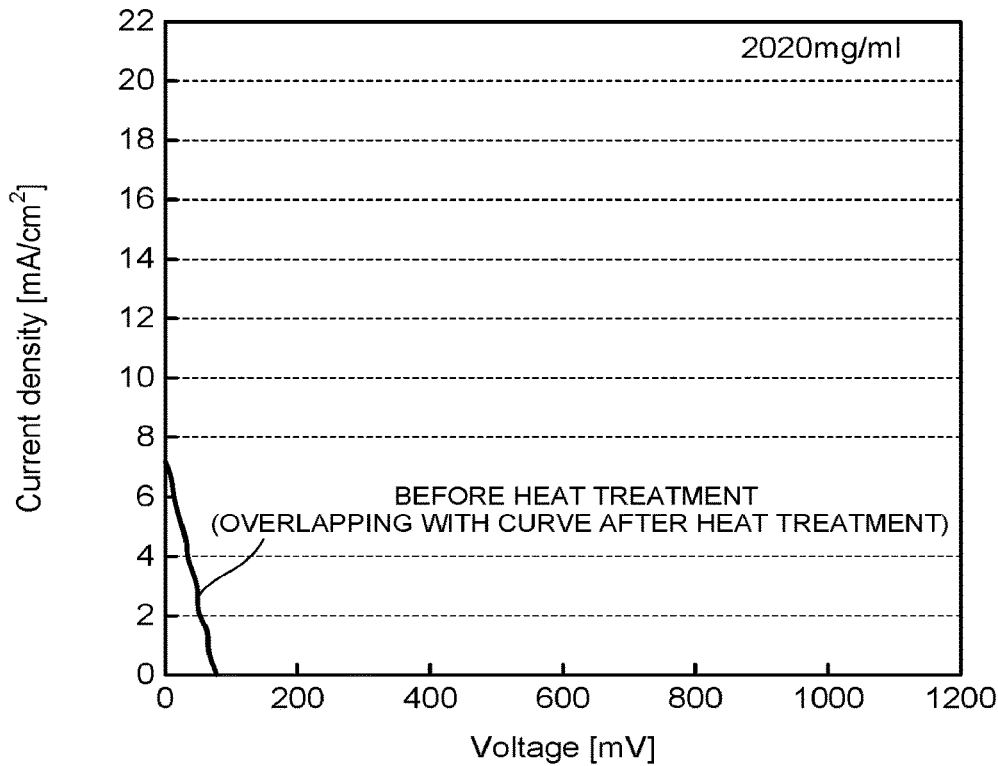
FIG. 29 is a chart illustrating IV characteristics of the photoelectric conversion element.

Effects of the heat treatment were compared while changing the concentration of the precursor in the coating solution. The same steps as those in Example 1 except the concentration of the precursor were performed. IV characteristics of these are illustrated in FIG. 27 to FIG. 29. As is clear from FIG. 27 to FIG. 29, even when the concentration of the precursor is increased to 1640 mg/ml and up to 1770 mg/ml, the effect by the heat treatment appears. However, in the case of the concentration of the precursor being 2020 mg/ml, the conversion efficiency does not improve even after the heat treatment and the IV curve is not distinct. This is conceivably because as the concentration of the precursor becomes higher, the crystal grain diameter of the perovskite compound becomes larger, and thus pin holes penetrating up to the intermediate layer become likely to occur at the time of polishing.

Comparative Example 1

Figure 30:
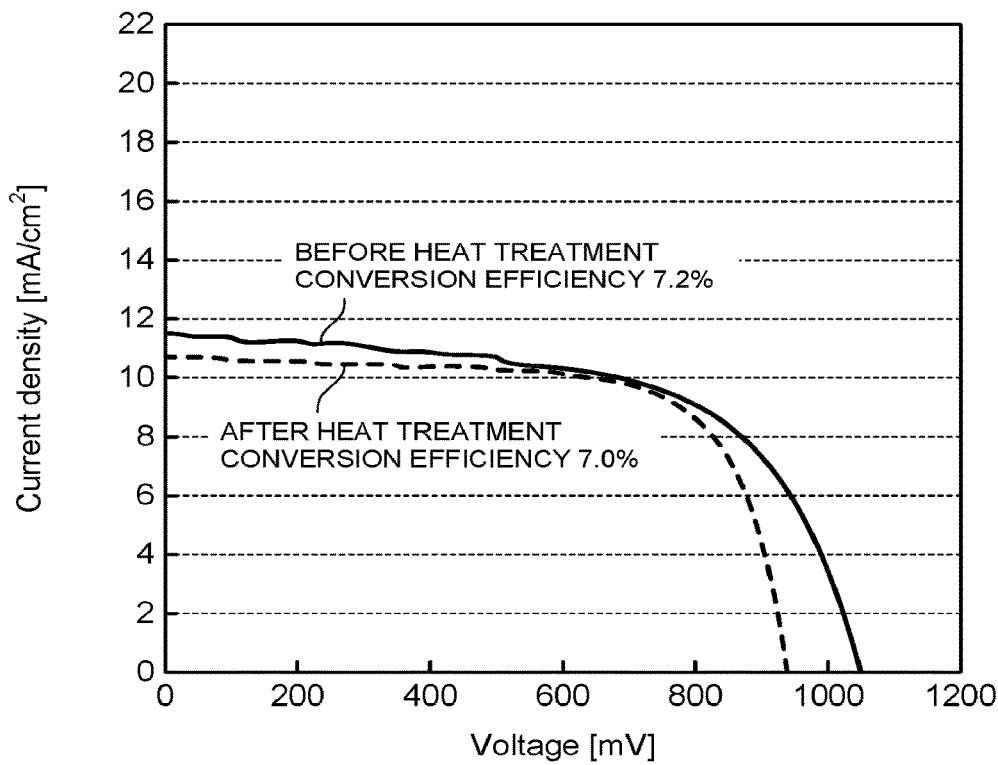
FIG. 30 is a chart illustrating IV characteristics of the photoelectric conversion element.

Elements were fabricated by the same operations as those in Example 1 except that the polishing was not performed, and IV characteristics before and after the heat treatment at 70° C. were compared. As is clear from the IV characteristics illustrated in FIG. 30, before and after the heat treatment, the respective parameters constituting the IV characteristic change, but the conversion efficiency hardly changes.

The above-described embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

While certain embodiments have been described, these embodiments have been presented by way of example only, and are not intended to limit the scope of the inventions. Indeed, the novel methods described herein may be embodied in a variety of other forms; furthermore, various omissions, substitutions and changes in the form of the methods described herein may be made without departing from the spirit of the inventions. The accompanying claims and their equivalents are intended to cover such forms or modifications as would fall within the scope and spirit of the inventions.

What is claimed is:

1. A method of manufacturing a photoelectric conversion element, the photoelectric conversion element, comprising:
    a first electrode;
    a second electrode; and
    a photoelectric conversion layer that is in contact with the first electrode and the second electrode and includes an active layer containing a perovskite compound, the method comprising:
    polishing a surface of a treatment object containing the perovskite compound to expose at least part of the perovskite compound; and
    heat-treating the polished treatment object.

2. The method according to claim 1, further comprising:
    before the polishing, applying a coating solution containing a precursor of the perovskite compound to the surface of the treatment object to form a coating layer; and
    between the forming the coating layer and the polishing, blowing a gas onto the coating layer and forming the perovskite compound.

3. The method according to claim 2,
    wherein a concentration of the precursor in the coating solution is 1770 mg/ml or less.

4. The method according to claim 2, further comprising before forming the coating layer, forming an intermediate layer on the treatment object.

5. The method according to claim 2, further comprising:
    between the forming the perovskite compound and the polishing, forming a second intermediate layer on the coating layer.

6. The method according to claim 1,
    wherein the active layer gives an X-ray diffraction pattern having a first diffraction peak ascribed to the (004) plane of the perovskite compound and a second diffraction peak ascribed to the (220) plane of the perovskite compound, and the ratio of the maximum intensity of the first diffraction peak to the maximum intensity of the second diffraction peak is 0.18 or more.

* * * * *